US012648078B2

(12) United States Patent
Odagaki et al.

(10) Patent No.: US 12,648,078 B2
(45) Date of Patent: Jun. 2, 2026

(54) BASE MEMBER, ELECTRONIC DEVICE, AND STRUCTURE

(71) Applicant: CANON KABUSHIKI KAISHA, Tokyo (JP)

(72) Inventors: Koichi Odagaki, Kanagawa (JP); Yoshihiko Fujise, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 306 days.

(21) Appl. No.: 18/481,116

(22) Filed: Oct. 4, 2023

(65) Prior Publication Data
US 2024/0032190 A1      Jan. 25, 2024

Related U.S. Application Data

(63) Continuation of application No. PCT/JP2022/015475, filed on Mar. 29, 2022.

(30) Foreign Application Priority Data

Apr. 6, 2021     (JP) ................................. 2021-065018

(51) Int. Cl.
| | |
|---|---|
| *H04N 23/68* | (2023.01) |
| *H01R 12/70* | (2011.01) |
| *H04N 23/50* | (2023.01) |
| *H05K 1/02* | (2006.01) |
| *H01R 12/71* | (2011.01) |
| *H05K 1/181* | (2026.01) |

(52) U.S. Cl.
CPC ....... *H05K 1/0284* (2013.01); *H01R 12/7082* (2013.01); *H04N 23/50* (2023.01); *H04N 23/6812* (2023.01); *H05K 1/0296* (2013.01); *H01R 12/714* (2013.01); *H05K 1/181*

(2013.01); *H05K 2201/09045* (2013.01); *H05K 2201/09118* (2013.01); *H05K 2201/09163* (2013.01); *H05K 2201/09236* (2013.01); *H05K 2201/09754* (2013.01); *H05K 2201/0999* (2013.01); *H05K 2201/10151* (2013.01)

(58) Field of Classification Search
None
See application file for complete search history.

(56) References Cited

U.S. PATENT DOCUMENTS

| | | | | |
|---|---|---|---|---|
| 2002/0172019 A1* | 11/2002 | Suzuki | ................. | H05K 1/0293 |
| | | | | 361/748 |
| 2011/0083889 A1* | 4/2011 | Niitsu | .................... | H01R 12/79 |
| | | | | 174/250 |
| 2017/0238415 A1* | 8/2017 | Kobayashi | ............. | H05K 1/183 |
| | | | | 361/748 |

FOREIGN PATENT DOCUMENTS

| | | |
|---|---|---|
| JP | S63-039986 U | 3/1988 |
| JP | H06326435 A | 11/1994 |
| JP | H10209642 A | 8/1998 |
| JP | 2008091554 A | 4/2008 |
| JP | 2013044645 A | 3/2013 |
| JP | 2019012778 A | 1/2019 |

* cited by examiner

*Primary Examiner* — Cynthia Calderon
(74) *Attorney, Agent, or Firm* — Canon U.S.A., Inc. IP Division

(57) ABSTRACT

A base member that is a molded part on which pattern wiring is directly formed, includes a projection projecting from a base surface of the base member. The pattern wiring is laid over a top of the projection, and protrusions are molded on both sides of an area at the top of the projection where the pattern wiring passes.

18 Claims, 18 Drawing Sheets

BASE MEMBER, ELECTRONIC DEVICE, AND STRUCTURE

CROSS-REFERENCE TO RELATED APPLICATIONS

This application is a Continuation of International Patent Application No. PCT/JP2022/015475, filed Mar. 29, 2022, which claims the benefit of Japanese Patent Application No. 2021-065018, filed Apr. 6, 2021, both of which are hereby incorporated by reference herein in their entirety.

BACKGROUND OF THE INVENTION

Field of the Invention

The present invention relates to a base member using a molded interconnect device (MID) technique.

Background Art

Electronic devices, such as a camera and a smartphone, and transportation apparatuses, such as an automobile, have recently been incorporating a built-in module including various sensors, or sensor module.

Among such sensor modules, ones to which a molded interconnect device (MID) technique is applied have been known.

The MID technique is a technique for irradiating predetermined locations of a base member with laser and forming a coating of metal plating only on the irradiated portions. The portions coated with the metal plating form a conductive pattern.

For example, Japanese Patent Application Laid-Open No. 2013-44645 discusses an MID package including a main body of substantially triangular pyramidal shape with mutually orthogonal first, second, and third pyramidal surfaces, on each of which a gyro element is mounted.

CITATION LIST

Patent Literature

PTL 1: Japanese Patent Laid-Open No. 2013-44645

In recent years, a demand for miniaturization of electronic devices has been increasing daily. A base member that includes small-sized sensors and can easily be accommodated in miniaturized electronic devices has thus been desired.

The MID package according to the conventional art discussed in the foregoing Patent Literature has large dimensions in height, width, and thickness, and has been hindering device miniaturization.

In accommodating the MID package in an electronic device, the triangular pyramidal shape is undesirable since dead space can often be left inside the device.

SUMMARY OF THE INVENTION

The present invention is directed to providing a small-sized base member having a shape suitable for accommodation in an electronic device.

According to an aspect of the present invention, a base member that is a molded part on which pattern wiring is directly formed, includes a projection projecting from a base surface of the base member. The pattern wiring is laid over a top of the projection, and protrusions are molded on both sides of an area at the top of the projection where the pattern wiring passes.

Further features of the present invention will become apparent from the following description of exemplary embodiments with reference to the attached drawings.

DESCRIPTION OF THE EMBODIMENTS

Exemplary embodiments of the present invention will be described in detail below with reference to the accompanying drawings.

A molded interconnect device (MID) refers to a resin molded article on which wiring and electrodes are formed.

In the exemplary embodiments, the resin molded article is formed by injection molding.

A first exemplary embodiment of the present invention will be described below with reference to FIGS. 1 to 6F.

Block Diagram Illustrating Configuration Example of Digital Camera 100

Figure 1:
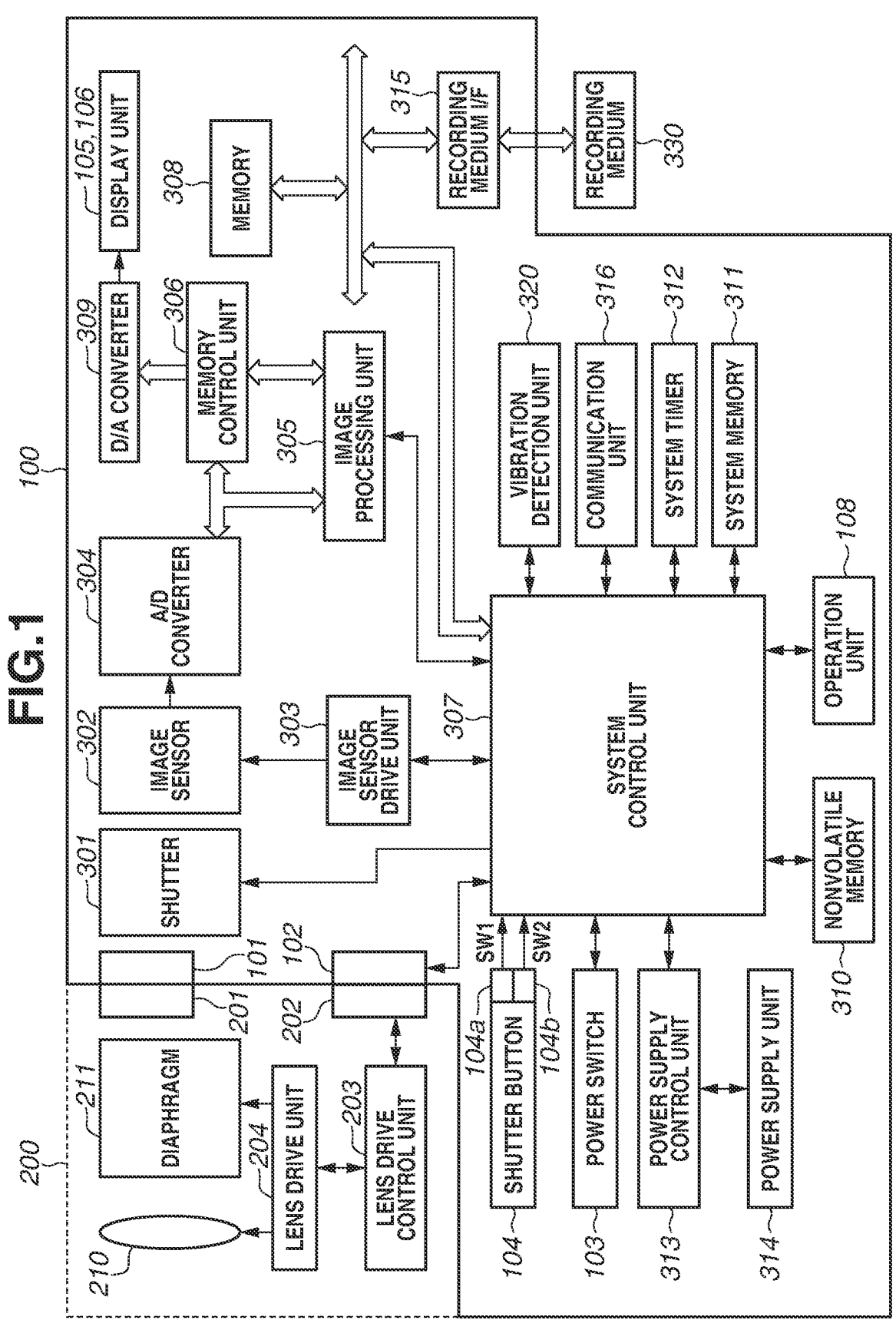
FIG. 1 is a block diagram illustrating a configuration of a camera according to a first exemplary embodiment of the present invention.

FIG. 1 is a block diagram illustrating a configuration example of a digital camera (hereinafter, camera) 100 according to the present exemplary embodiment. The camera 100 is an interchangeable lens camera to which a lens unit 200 can be detachably attached.

Figure 2A:
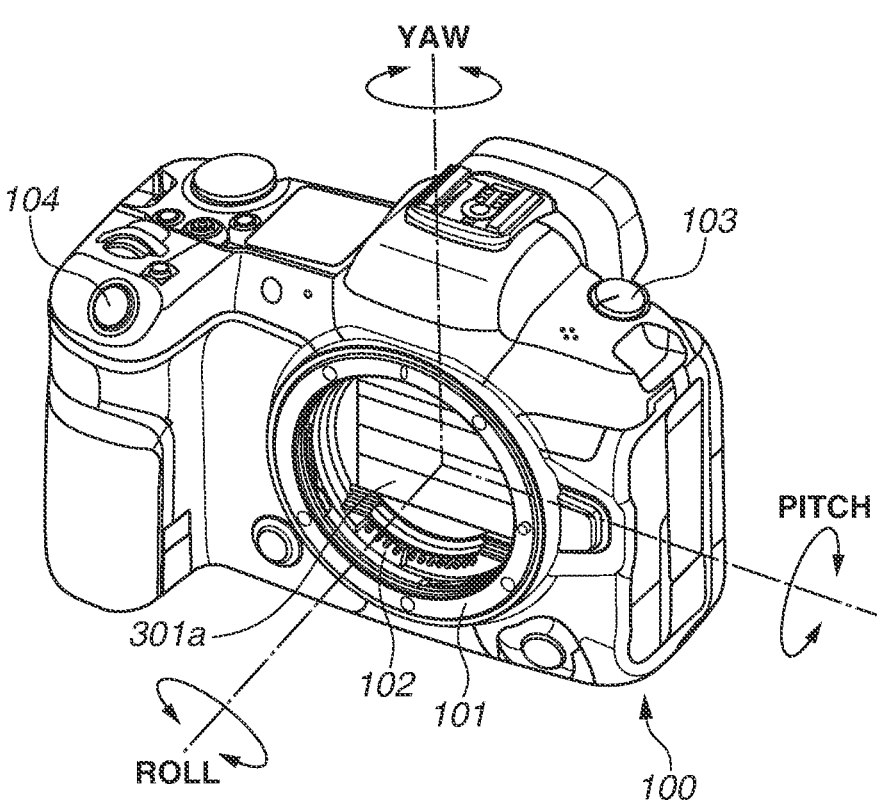
FIG. 2A is an external perspective view of the camera according to the first exemplary embodiment of the present invention.
Figure 2B:
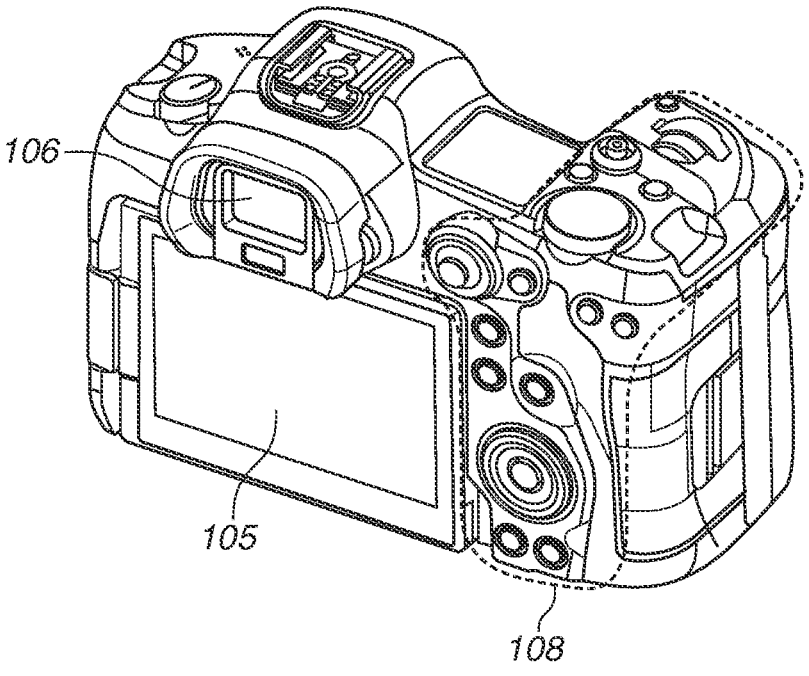
FIG. 2B is an external perspective view of the camera according to the first exemplary embodiment of the present invention.

FIGS. 2A and 2B are external perspective views of the camera 100.

The lens unit 200 illustrated in FIG. 1 is fixed to the camera 100 by a lens mount 201 included in the lens unit 200 and a lens mount 101 included in the camera 100.

The lens unit 200 and the camera 100 are configured to be able to communicate with each other via a connector 202 included in the lens unit 200 and a connector 102 included in the camera 100.

More specifically, a system control unit 307 and a lens drive control unit 203 communicate with each other. The lens drive control unit 203 controls a lens drive unit 204 based on signals from the system control unit 307, and the lens drive unit 204 drives a diaphragm 211 and a lens 210.

A lens 210 is intended to form an optical image of an object on an image sensor 302.

A shutter 301 is located between the image sensor 302 and the lens 210. In a non-imaging state, the shutter 301 blocks the light from the lens 210 to the image sensor 302.

During imaging, the shutter 301 is opened under control of the system control unit 307 so that the lens 210 is enabled to form an optical image on the image sensor 302.

The image sensor 302 includes a charge-coupled device (CCD) or complementary metal-oxide-semiconductor (CMOS) device for converting the optical image into an electrical signal.

An analog-to-digital (A/D) converter 304 converts an analog signal into a digital signal. The A/D converter 304 is used to convert an analog signal output from the image sensor 302 into a digital signal.

An image processing unit 305 performs predetermined resize processing, such as pixel interpolation and reduction, and color conversion processing on data from the A/D converter 304 or data from a memory control unit 306.

The image processing unit 305 also performs predetermined calculation processing using the captured image data. The system control unit 307 performs exposure control and ranging control based on the obtained calculation result.

Through-the-lens (TTL) automatic focus (AF) processing, automatic exposure (AE) processing, and electronic flash (EF; preliminary flash emission) processing are thereby performed.

The image processing unit 305 further performs predetermined calculation processing using the captured image data, and performs TTL automatic white balance (AWB) processing based on the obtained calculation result.

The output data from the A/D converter 304 is written to a memory 308 via the image processing unit 305 and the memory control unit 306, or directly via the memory control unit 306.

The memory 308 stores image data for displaying the digital image data converted by the A/D converter 304 on a display unit 105 or a display unit 106.

The memory 308 also serves as an image display memory (video memory).

A digital-to-analog (D/A) converter 309 converts image display data stored in the memory 308 into an analog signal, and supplies the analog signal to the display unit 105 or 106.

The image display data written to the memory 308 is thereby displayed on the display unit 105 or 106 via the D/A converter 309.

The display units 105 and 106 provide display on their display, such as a liquid crystal display (LCD), based on the analog signal from the D/A converter 309.

The digital signal once A/D-converted by the A/D converter 304 and stored in the memory 308 is analog-converted by the D/A converter 309.

The resulting analog signal is able to be successively transferred to and displayed on the display unit 105 or 106 to provide a through-lens image display (live view display).

A nonvolatile memory 310 is a memory serving as an electrically erasable and recordable recording medium. For example, an electrically erasable programmable read-only memory (EEPROM) is used.

The nonvolatile memory 310 stores operating constants and programs of the system control unit 307.

The system control unit 307 is a control unit including at least one processor, and controls the entire camera 100 and the lens unit 200.

A system memory 311 includes a random access memory (RAM). The operating constants and variables of the system control unit 307 and the programs read from the nonvolatile memory 310 are loaded into the system memory 311.

The system control unit 307 also performs display control by controlling the memory 308, the D/A converter 309, and the display units 105 and 106.

A system timer 312 is a clocking unit that measures time for use in various types of control and the time of a built-in clock.

A first shutter switch 104a turns on to generate a first shutter switch signal SW1 when a shutter button 104 on the camera 100 is operated halfway, in other words, half-pressed (imaging preparation instruction).

The operations of the AF processing, AE processing, AWB processing, and EF (preliminary flash emission) processing are started based on the first shutter switch signal SW1.

A second shutter switch 104b turns on to generate a second shutter switch signal SW2 when the shutter button 104 is fully operated, in other words, fully pressed (imaging instruction).

The system control unit 307 causes the shutter 301 to drive a shutter blade 301a based on the second shutter switch signal SW2.

A series of imaging processing operations from the reading of a signal from the image sensor 302 to the writing of image data to a recording medium 330 is then started.

The shutter blade 301a moves at high speed in a direction perpendicular to the optical axis of the lens 210 inside the shutter 301, and instantaneously stops moving by impinging on a stopper member (not illustrated) in the shutter 301.

An operation unit 108 includes various operation members that are assigned appropriate functions scene by scene by the user selecting and operating various function icons displayed on the display units 105 and 106, and functions as various function buttons.

Examples of the function buttons include an end button, a return button, an image scroll button, a jump button, a narrow-down button, and an attribute change button.

For example, if a menu button is pressed, a menu screen with which various settings are settable is displayed on the display unit 105 or 106.

The camera 100 is powered on and off using a power switch 103.

A power supply control unit 313 includes a battery detection circuit, a direct-current-to-direct-current (DC-DC) converter, and a switch circuit for switching blocks to be energized. The power supply control unit 313 detects the presence or absence of a battery attached, the type of battery, and the remaining battery level.

The power supply control unit 313 controls the DC-DC converter based on the detection results and instructions from the system control unit 307, and supplies predetermined voltages to various units including the recording medium 330 for predetermined periods.

A power supply unit 314 includes a primary battery, such as an alkali battery and a lithium battery, a secondary battery, such as a nickel-cadmium (NiCd) battery, a nickel metal hydride (NiMH) battery, and a lithium-ion (Li) battery, and/or an alternating current (AC) adaptor.

A recording medium interface (I/F) 315 is an I/F with the recording medium 330.

The recording medium 330 is a recording medium, such as a memory card and a hard disk, for recording captured images, and includes a semiconductor memory, an optical disc, or a magnetic disk.

A communication unit 316 establishes connection wirelessly or using a cable, and transmits and receives a video signal and an audio signal.

The communication unit 316 is also connectable to a wireless local area network (LAN) and the Internet.

The communication unit 316 is able to transmit images captured by the image sensor 302 (including through-lens images) and images recorded on the recording medium 330, and receive image data and other various types of information from external devices.

Vibration Detection Unit 320/Gyro Sensors

A vibration detection unit 320 includes gyro sensors, for example, and detects the amounts of vibration of the camera 100.

The vibration detection unit 320 detects vibration and the amounts of vibration of the camera 100 in three axial directions including a pitch direction, a yaw direction, and a roll direction.

In the camera 100 illustrated in FIG. 1, an image sensor drive unit 303 makes an optical vibration correction by controlling movement of the image sensor 302 based on the amounts of vibration detected by the vibration detection unit 320.

The image processing unit 305 makes an electronic vibration correction on an image under control of the system control unit 307 based on the amounts of vibration detected by the vibration detection unit 320.

Exploded Perspective View of Camera 100

Figure 3:
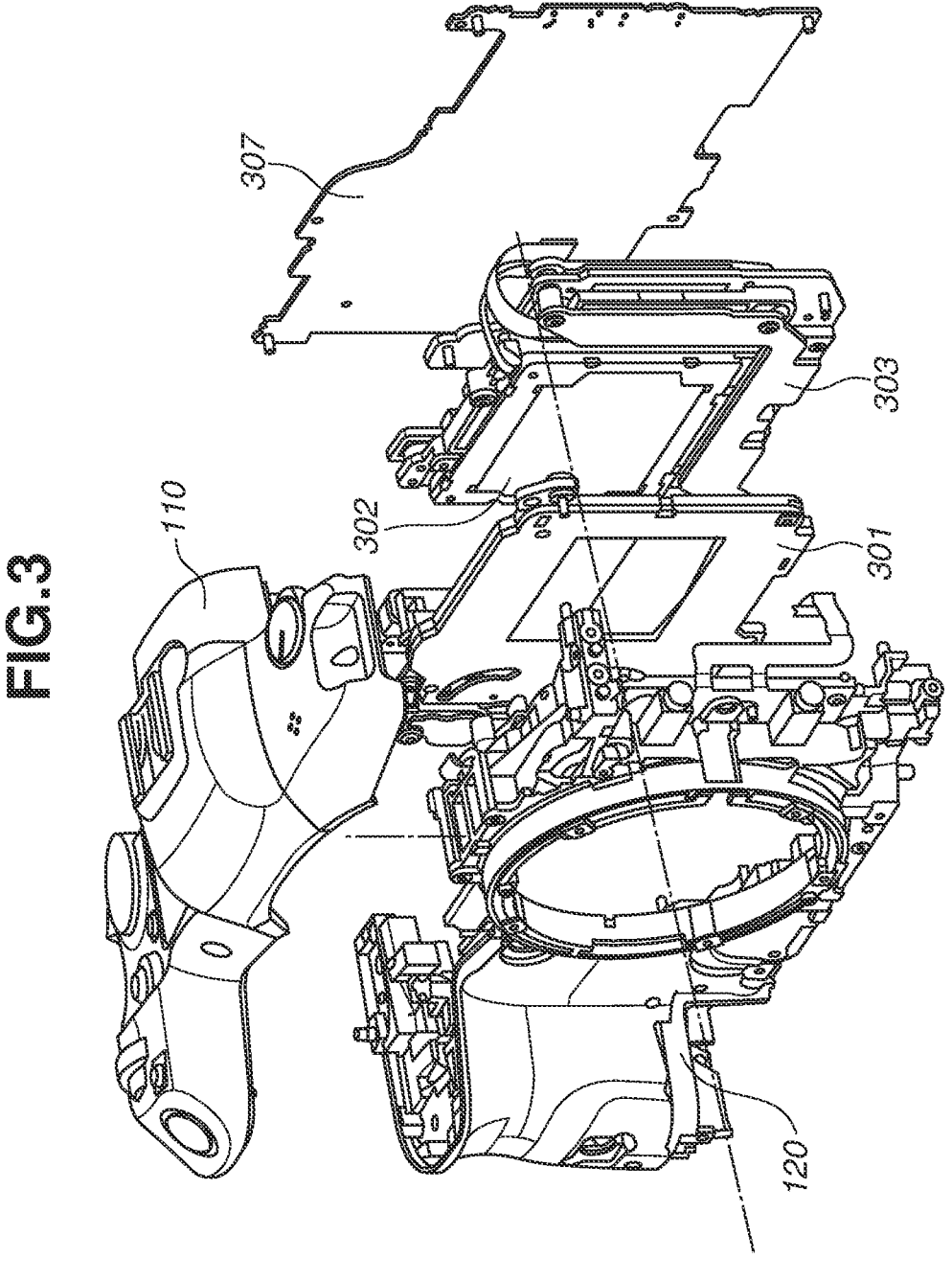
FIG. 3 is an exploded perspective view of the camera according to the first exemplary embodiment of the present invention.

FIG. 3 is an exploded perspective view of the camera 100 where a front, rear, and bottom cover members are removed.

A base plate 120 is a structure in charge of the strength of the camera 100. The shutter 301, the image sensor 302, the image sensor drive unit 303, and the system control unit 307 are fastened to the base plate 120 with screws (not illustrated).

A top cover unit 110 is fastened to the base plate 120 with screws (not illustrated).

External Perspective View of Top Cover Unit 110

Figure 4A:
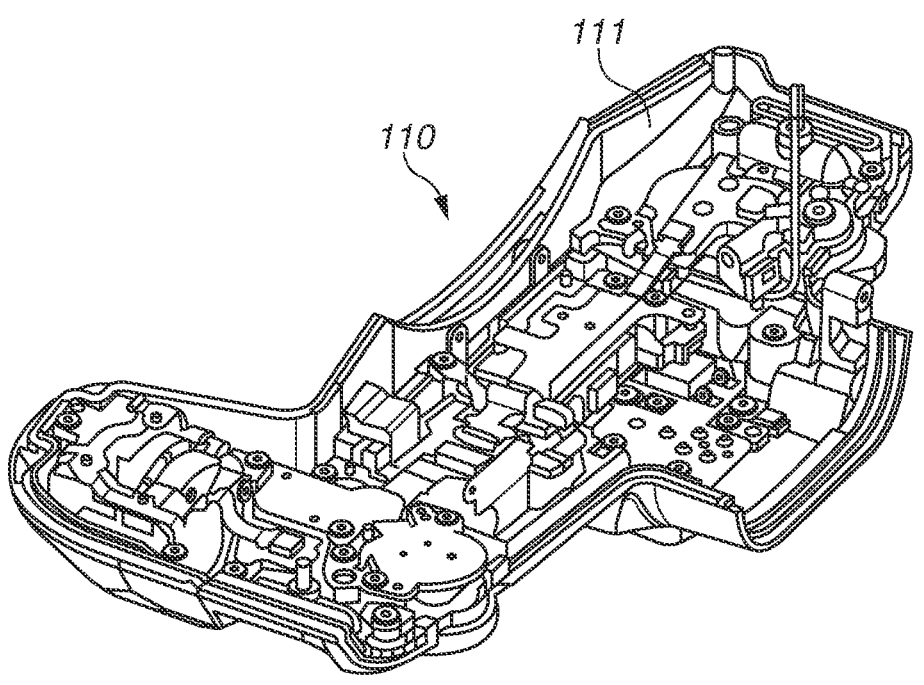
FIG. 4A is a perspective view illustrating an internal structure of a top cover unit according to the first exemplary embodiment of the present invention.
Figure 4B:
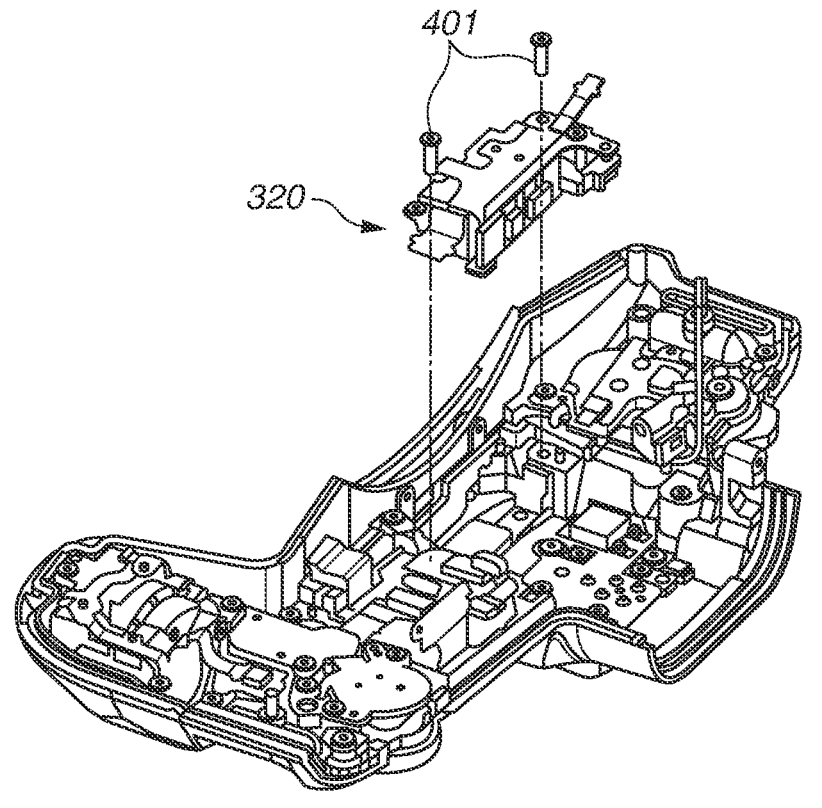
FIG. 4B is a perspective view illustrating an internal structure of a top cover unit according to the first exemplary embodiment of the present invention.

FIG. 4A is an external perspective view of the top cover unit 110. FIG. 4B is an exploded perspective view of the top cover unit 110.

The top cover unit 110 includes a top cover member 111, the power switch 103, and the shutter button 104. The top cover member 111 covers the top surface of the camera 100.

As illustrated in FIG. 4B, the vibration detection unit 320 is fastened to the center of the top cover member 111 with screws 401.

Exploded Perspective View of Vibration Detection
Unit 320

Figure 5A:
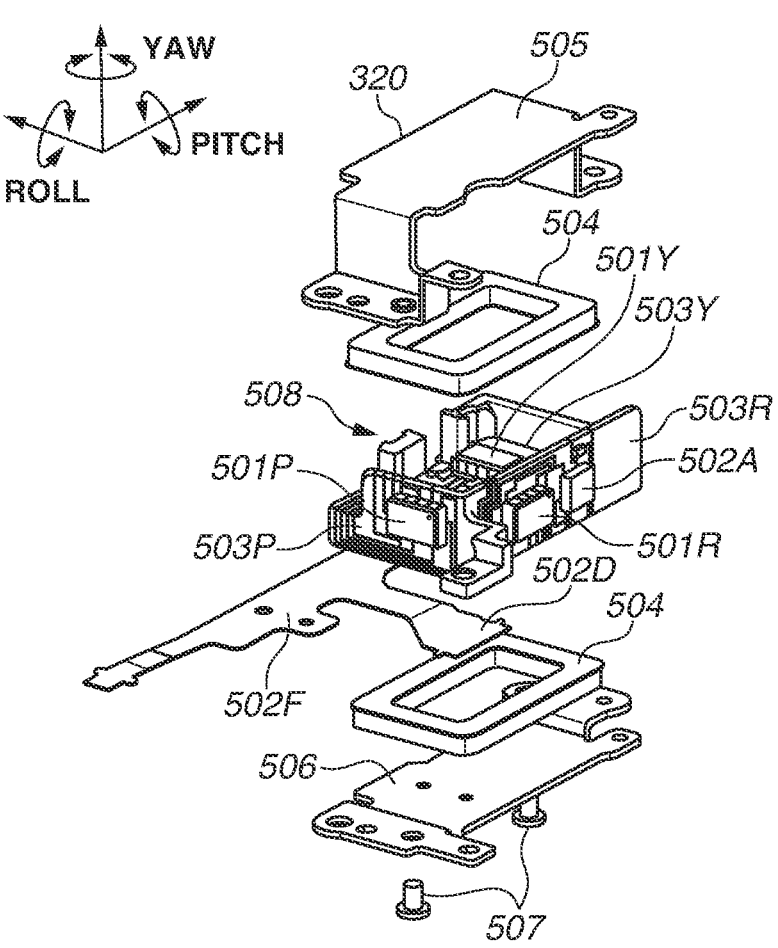
FIG. 5A is an exploded perspective view of a vibration detection unit according to the first exemplary embodiment of the present invention.
Figure 5B:
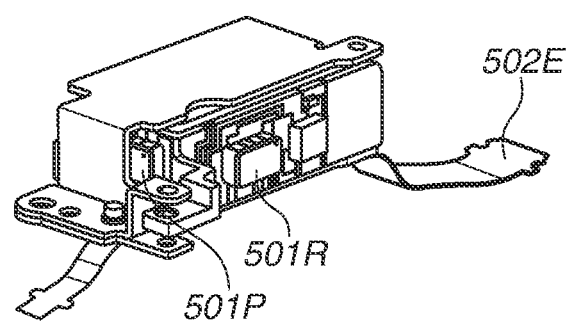
FIG. 5B is a side view of the vibration detection unit according to the first exemplary embodiment of the present invention.
Figure 5C:
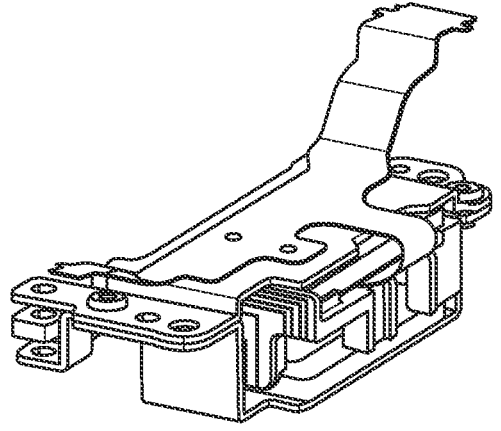
FIG. 5C is a side view of the vibration detection unit according to the first exemplary embodiment of the present invention.

FIG. 5A is an exploded perspective view of the vibration detection unit 320. FIGS. 5B and 5C are external perspective views of the vibration detection unit 320.

The vibration detection unit 320 includes plates 505 and 506, buffer members 504, a sensor module 508, and a flexible circuit board 502F.

The sensor module 508 includes gyro sensors 501P, 501R, and 501Y for measuring angular velocity, and an acceleration sensor 502A for detecting acceleration.

The sensor module 508 further includes passive elements 502R (see FIGS. 6A to 6F), such as resistors and capacitors, for driving the three gyro sensors 501P, 501R, and 501Y, and the acceleration sensor 502A.

The flexible circuit board 502F includes a terminal portion 502D and a terminal portion 502E.

The terminal portion 502D is connected to a connector 502C of the sensor module 508 (see FIGS. 6A to 6F).

The terminal portion 502E is electrically connected to a connector (not illustrated) constituting a part of a path to the system control unit 307.

This enables the sensor module 508 and the system control unit 307 to be capable of various types of predetermined communications via the flexible circuit board 502F.

Through such communications, the system control unit 307 is able to obtain detection values detected by the gyro sensors 501P, 501R, and 501Y, and the acceleration sensor 502A.

The buffer members 504 are made of a vibration-absorbing elastic material, such as sponge.

The vibration detection unit 320 includes two buffer members 504.

The two buffer members 504 are disposed on respective different surfaces opposed to the sensor module 508 so that the sensor module 508 is sandwiched therebetween.

In the present exemplary embodiment, the buffer members 504 are disposed on surfaces substantially parallel to a main wall 503Y where the gyro sensor 501Y is disposed.

The plates 505 and 506 have surfaces substantially parallel to the main wall 503Y. The plates 505 and 506 sandwich the sensor module 508 and the buffer members 504 therebetween.

The plate 505 and the sensor module 508 compress one of the buffer members 504, and the plate 506 and the sensor module 508 compress the other.

The plates 505 and 506 are configured so as not to touch the sensor module 508.

The plates 505 and 506 are fastened with screws 507, so that the vibration detection unit 320 is completed.

External Perspective Views of Sensor Module 508

Figures 6A, 6B, 6C:
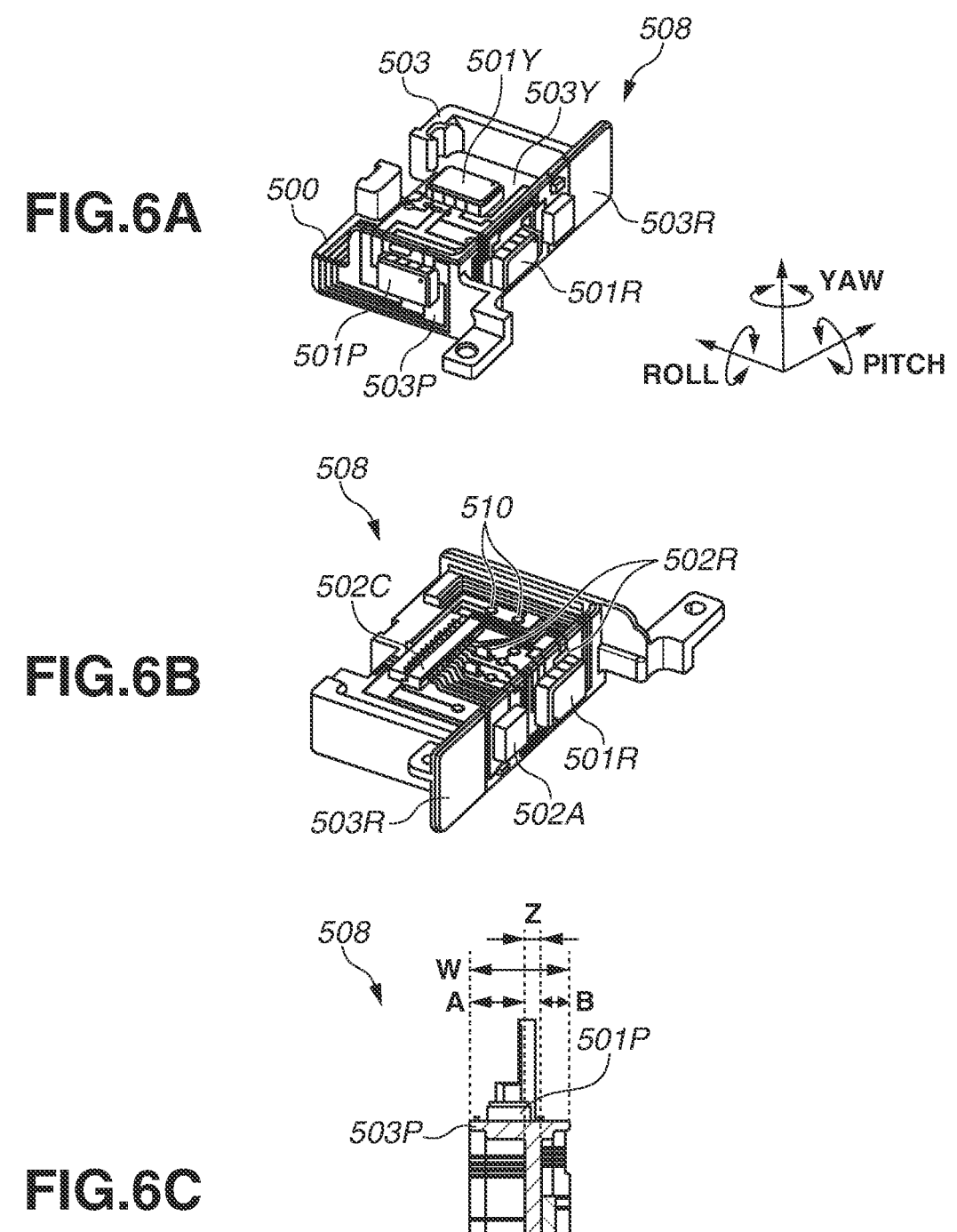
FIG. 6A is an external perspective view of a sensor module according to the first exemplary embodiment of the present invention.
FIG. 6B is an external perspective view of the sensor module according to the first exemplary embodiment of the present invention.
FIG. 6C is a sectional view of essential parts of the sensor module according to the first exemplary embodiment of the present invention.

FIGS. 6A and 6B are external perspective views of the sensor module 508. FIG. 6C is a sectional view of essential parts of the sensor module 508.

A base member 503 illustrated in FIGS. 6A to 6F is a member for holding the gyro sensors 501P, 501R, and 501Y at predetermined positions. The base member 503 is molded of a material such as plastic and liquid crystal polymers (LCPs).

The base member 503 includes a first side wall 503P substantially orthogonal to the axis of rotation in the pitch direction, a second side wall 503R substantially orthogonal to the axis of rotation in the roll direction, and the main wall 503Y substantially orthogonal to the axis of rotation in the yaw direction.

In other words, the first side wall 503P is orthogonal to the main wall 503Y. The second side wall 503R is orthogonal to both the main wall 503Y and the first side wall 503P.

The gyro sensor 501P is mounted on the first side wall 503P, the gyro sensor 501R the second side wall 503R, and the gyro sensor 501Y the main wall 503Y.

The gyro sensors 501P, 501R, and 501Y are directly mounted on lands of pattern wiring 500 on the base member 503 by soldering.

The sensor module 508 is configured as described above.

The gyro sensor 501P thus detects vibration and the amount of vibration in the pitch direction of the camera 100, the gyro sensor 501R detects those in the roll direction, and the gyro sensor 501Y detects those in the yaw direction.

The connector 502C is mounted on a surface of the main wall 503Y opposite to where the gyro sensor 501Y is mounted.

The surface of the main wall 503Y where the gyro sensor 501Y is mounted will be referred to as a first surface 509, and the surface of the main wall 503Y where the connector 502C is mounted as a second surface 510.

The acceleration sensor 502A is mounted on the second side wall 503R.

As illustrated in FIGS. 6A and 6B, the pattern wiring 500 is directly laid on the base member 503.

The pattern wiring 500 is formed by an MID technique.

The MID technique refers to a technique for forming a pattern by irradiating predetermined locations of a base material with laser and plating only the laser-irradiated portions with metal.

The gyro sensors 501P, 501R, and 501Y for detecting vibration, the acceleration sensor 502A, and various passive elements 502R for driving these sensors will now be described.

The gyro sensors 501P, 501R, and 501Y, the acceleration sensor 502A, and the passive elements 502R are directly mounted on mounting lands formed by the pattern wiring 500 on the base member 503 by soldering.

The gyro sensors 501P, 501R, and 501Y, the acceleration sensor 502A, the passive elements 502R, and the connector 502C are electrically connectable as appropriate by the pattern wiring 500.

FIG. 6C is a sectional view of essential parts of the sensor module 508.

The thickness of the main wall 503Y will be denoted by Z. The length of the shorter of the first and second side walls 503P and 503R in a direction orthogonal to the main wall 503Y will be denoted by W. Here, W is greater than Z.

The height of the taller of the first and second side surfaces 503P and 503R from the first surface 509 will be denoted by A. The height of the taller of the first and second side surfaces 503P and 503R from the second surface 510 will be denoted by B.

The height from the first surface 509 to the top surface of the gyro sensor 501Y will be denoted by C, and the height from the second surface 510 to the top surface of the connector 502C will be denoted by D.

Here, A is greater than or equal to C. B is greater than or equal to D.

The present exemplary embodiment is configured as described above.

The gyro sensor 501Y and the connector 502C therefore do not protrude from the taller of the first and second side walls 503P and 503R in the direction perpendicular to the main wall 503Y.

This can reduce the height of the sensor module 508 in the direction orthogonal to the main wall 503Y.

Figure 6D:
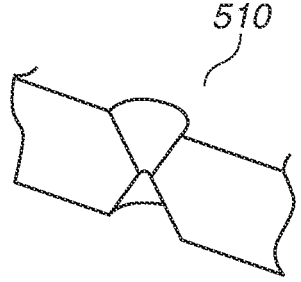
FIG. 6D is a plan view of a land configuration of the sensor module according to the first exemplary embodiment of the present invention.

FIG. 6D is an enlarged view of lands 522 for mounting the gyro sensor 501P, formed on the first side wall 503P.

The gyro sensor 501P is mounted on the first side wall 503P by reflow soldering.

In FIG. 6D, the direction of gravity in melting cream solder to reflow-mount the gyro sensor 501P on the first side wall 503P is indicated by the arrow G.

A direction orthogonal to the direction of gravity and parallel to the first side wall 503P is indicated by the arrow H.

In ordinary reflow mounting on a flat substrate, the parts to be mounted constantly undergo the gravity in a direction perpendicular to the surface for the parts to be mounted on.

By contrast, in the case of the vibration detection unit 320 according to the present exemplary embodiment, the gyro sensors 501P, 501R, and 501Y are mounted on three respective surfaces orthogonal to each other.

As a result, at least one of the gyro sensors 501P, 501R, and 501Y undergoes the gravity in a direction parallel to the surface for the sensor to be mounted on during reflow mounting.

In the present exemplary embodiment, the gyro sensor 501P is mounted on the first side wall 503P with the gravity acting in the direction of the arrow G.

The gyro sensor 501P can thus be displaced from a desired mounting position in the direction of the arrow G due to the gravity acting in the direction of the arrow G when the solder is melted.

Suppose that a land row A and a land row B include five lands each. The amount of application of solder to the lower land row B in FIG. 6D is then made smaller than that to the other land row A.

As a result, the surface tension of the solder applied to the land row A becomes greater than that of the solder applied to the land row B.

The surface tension of the solder thus produces force acting on the gyro sensor 501P in the direction opposite from the arrow G. The gravity acting on the gyro sensor 501P in the direction of the arrow G is thereby cancelled, thus preventing mounting misalignment due to the gravity during the reflow mounting.

As illustrated in FIGS. 6A and 6B, the base member 503 has a plurality of vias 510 for electrically connecting one side of the main wall 503Y to the other.

Figure 6E:
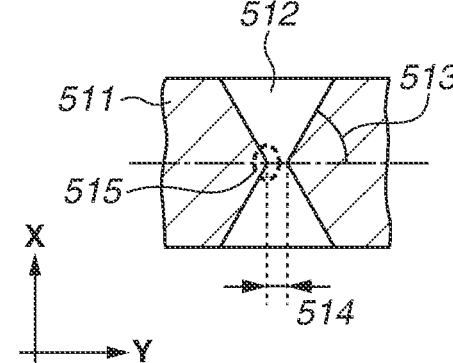
FIG. 6E is a perspective sectional view of a via of the sensor module according to the first exemplary embodiment of the present invention.
Figure 6F:
FIG. 6F is an enlarged sectional view of the via of the sensor module according to the first exemplary embodiment of the present invention.

FIG. 6E is an enlarged perspective sectional view of a portion of the base member 503 where a via 510 is disposed. FIG. 6F is an enlarged sectional view of the portion of the base member 503 where the via 510 is disposed.

The main wall 503Y is the largest flat wall, so that the molds for molding the base member 503 are most productive if configured to be parted in the direction perpendicular to the main wall 503Y.

In the present exemplary embodiment, the vias 510 are therefore disposed only in the main wall 503Y so that the direction of holes 512 of the vias 510 is the same as the parting direction for the sake of a simple mold structure.

In the present exemplary embodiment, as illustrated in FIGS. 6E and 6F, each via 510 has a hole 512 shaped like a stack of two cones, formed symmetrically about the center of the main wall 503Y in the thickness direction.

The cones are shaped to have the smallest diameter at the center of the main wall 503Y in the thickness direction and increase in diameter with an increasing distance from the center in the thickness direction.

The circle diameter of the hole 512 at a via vertex 515 will be referred to as a via diameter 514. The hole 512 runs through a base member 511 while increasing in diameter with a constant via angle 513, starting at the via vertex 515, until the hole 512 is opened on the surfaces of the base member 503.

A trace is directly laid on the inner wall of the hole 512 from one side of the main wall 503Y to the other through the MID technique.

The patterns laid on one side and the other of the base member 511 are thus electrically connected via the via 510.

The reason why the holes 512 according to the present exemplary embodiment have the foregoing shape instead of simple cylindrical holes through the main wall Y is to facilitate the laser irradiation of the inner walls of the holes 512 for pattern formation.

Side Views of Sensor Module 508

Figure 7A:
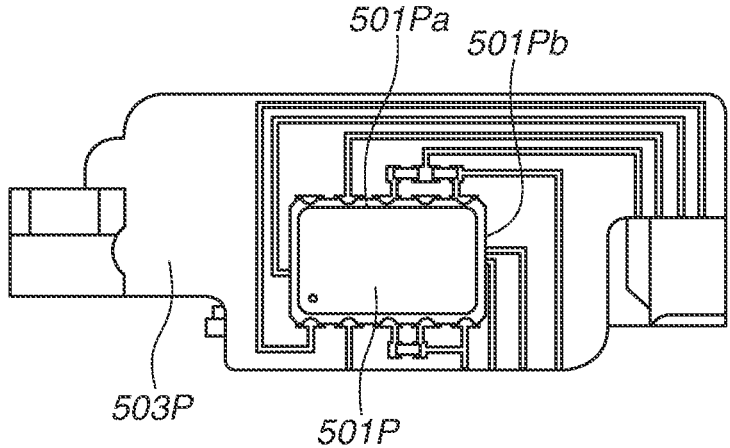
FIG. 7A is a side view of the sensor module according to the first exemplary embodiment of the present invention.
Figure 7B:
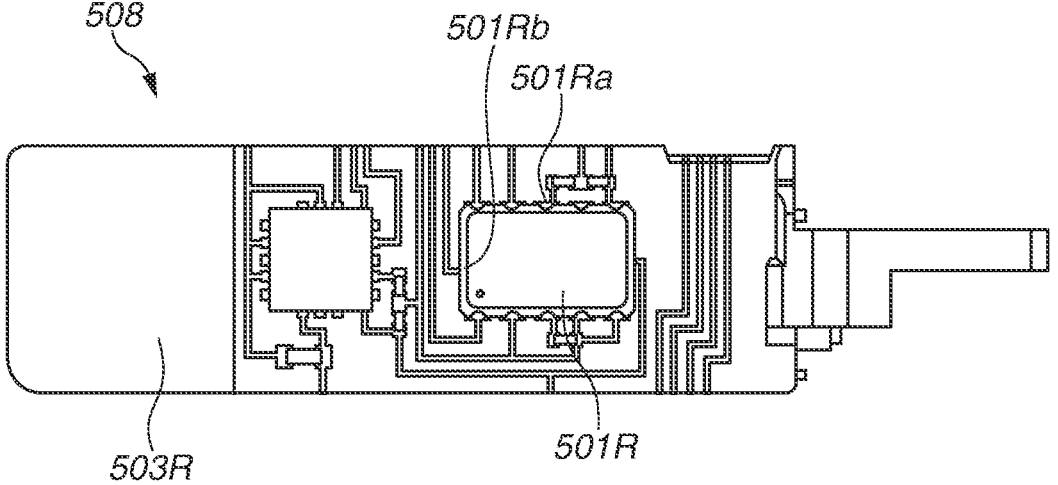
FIG. 7B is a side view of the sensor module according to the first exemplary embodiment of the present invention.

FIGS. 7A and 7B are side views of the sensor module 508. FIG. 7A illustrates the first side wall 503P. FIG. 7B illustrates the second side wall 503R.

Each of the gyro sensors 501Y, 501R, and 501P according to the present exemplary embodiment is substantially rectangular when seen in a direction perpendicular to the surface where the gyro sensor is mounted.

The gyro sensor 501R thus has long sides 501Ra and short sides 501Rb. The gyro sensor 501P has long sides 501Pa and short sides 501Pb.

In the present exemplary embodiment, the gyro sensors 501R and 501P are attached to the base member 503 so that the short sides 501Rb and 501Pb are parallel to the direction orthogonal to the main wall 503Y.

This can reduce the height of the first and second side walls 503P and 503R in the direction orthogonal to the main wall 503Y.

Next, a sensor module that is a second exemplary embodiment of the present invention will be described with reference to FIGS. 8A and 8B.

Perspective View of Sensor Module 2508

The only difference between the first exemplary embodiment and the present exemplary embodiment is the sensor module. Only differences of a sensor module 2508 according to the second exemplary embodiment from the sensor module 508 according to the first exemplary embodiment will thus be described.

Figure 8A:
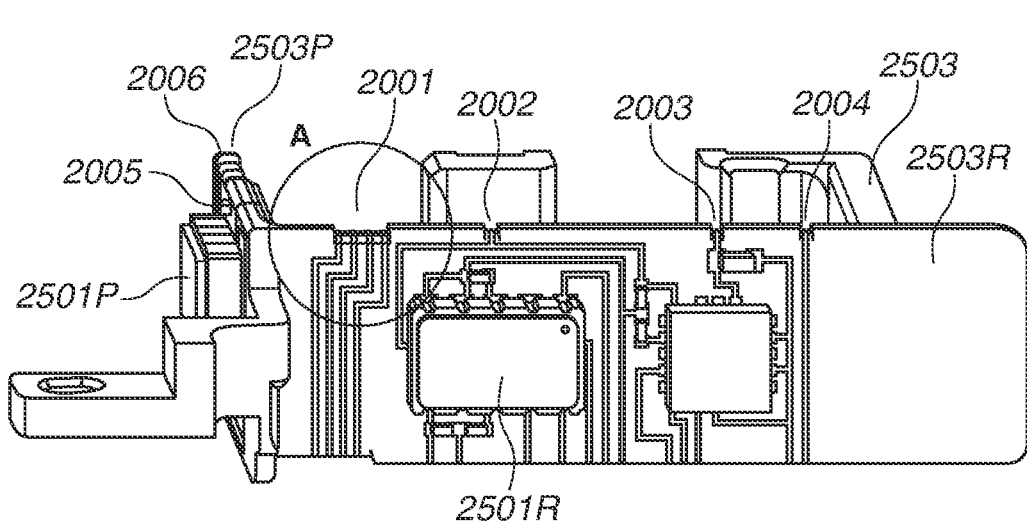
FIG. 8A is a perspective view of a sensor module that is a second exemplary embodiment of the present invention.

FIG. 8A is a perspective view of the sensor module 2508 that is the second exemplary embodiment of the present invention. FIG. 8B is an enlarged view of a portion A in FIG. 8A.

The sensor module 2508 includes a pitch direction detection gyro sensor 2501P, a roll direction detection gyro sensor 2501R, and a yaw direction detection gyro sensor (not illustrated) on a base member 2503.

The pitch direction detection gyro sensor 2501P, the roll direction detection gyro sensor 2501R, and the yaw direction detection gyro sensor (not illustrated) are mounted on a first side wall 2503P, a second side wall 2503R, and a main wall (not illustrate), respectively.

The sensor module 2508 according to the second exemplary embodiment is different from the sensor module 508 according to the first exemplary embodiment in the following points.

A first wiring recess 2001, a second wiring recess 2002, and a third wiring recess 2003 are formed in areas at the tops of the first side wall 2503P and the second side wall 2503R where pattern wiring 2500 passes.

A fourth wiring recess 2004, a fifth wiring recess 2005, and a sixth wiring recess 2006 are formed in areas at the top of the first side wall 2503P and the second side wall 2503R where the pattern wiring 2500 passes.

Figure 8B:
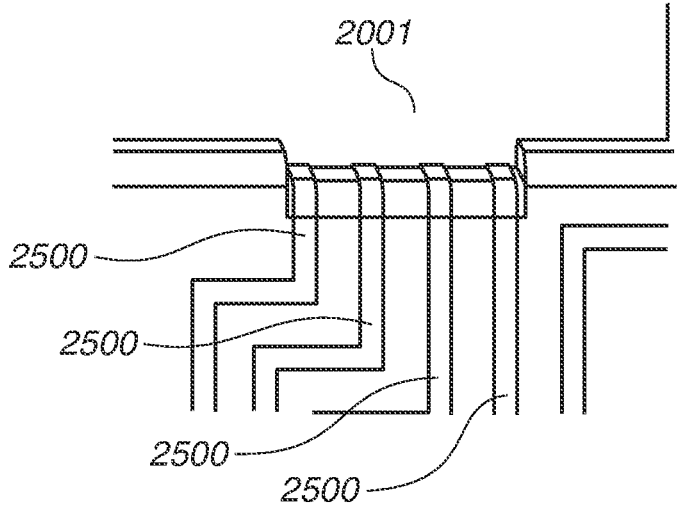
FIG. 8B is an enlarged view of the sensor module that is the second exemplary embodiment of the present invention.

As illustrated in FIG. 8B, the first wiring recess 2001 is formed in an area at the top of the second side wall 2503R where the pattern wiring 2500 passes.

The areas of the second side wall 2503R where the pattern wiring 2500 passes are one level lower than the other areas at the top of the second side wall 2503R.

The tops of the first and second side walls 2503P and 2503R are portions likely to contact other members and tools compared to the other portions.

The tops of the first and second side walls 2503P and 2503R are portions likely to contact other members and tools in assembling the sensor module 2508 and in attaching the sensor module 2508 into the camera 100.

In the present exemplary embodiment, the recesses, such as the first wiring recess 2001, are therefore provided to reduce the risk of disconnection of the pattern wiring 2500 passing over the tops of the first and second side walls 2503P and 2503R due to the foregoing contact.

The present exemplary embodiment will now be summarized.

The base member 2503 is an injection-molded article on which the pattern wiring 2500 is directly formed.

The base member 2503 includes a projection 2503P projecting from its base surface.

The pattern wiring 2500 is laid over the top of the projection 2503P.

Protrusions are molded on both sides of an area at the top of the projection 2503p where the pattern wiring 2500 passes.

Next, a wiring recess 3001 of a sensor module that is a third exemplary embodiment of the present invention will be described with reference to FIG. 9.

Enlarged View of Wiring Recess 3001

The only difference between the second exemplary embodiment and the present exemplary embodiment is the shape of the wiring recesses formed in the tops of the first and second side walls.

Figure 9:
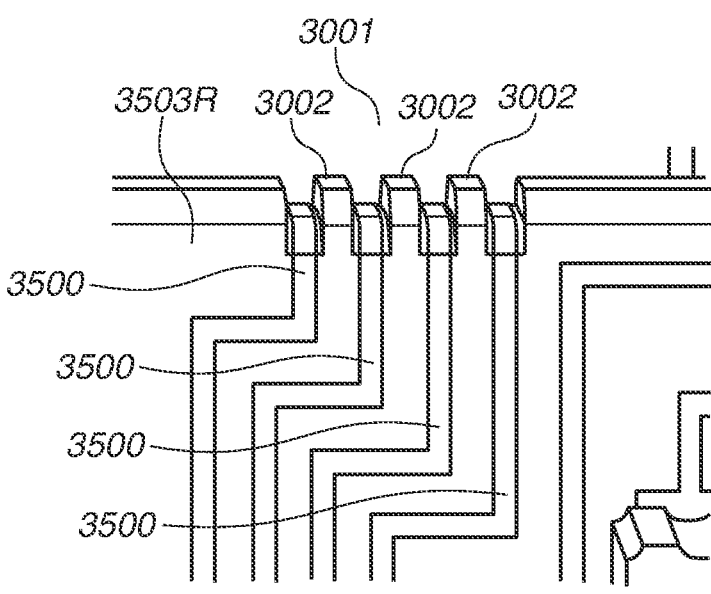
FIG. 9 is an enlarged view of a wiring recess according to a third exemplary embodiment of the present invention.

FIG. 9 is an enlarged view of a wiring recess 3001 according to the third exemplary embodiment of the present invention.

As illustrated in FIG. 9, the wiring recess 3001 is formed in an area at the top of a second side wall 3503R where pattern wiring 3500 passes. The wiring recess 3001 is different from the first wiring recess 2001 according to the second exemplary embodiment.

The wiring recess 3001 includes protective protrusions 3002 between traces of the pattern wiring 3500.

The pattern wiring 3500 passing over the top of the second side wall 3503R is made even less likely to contact other members and tools by the action of the protective protrusions 3002, so that the risk of disconnection of the pattern wiring 3500 can be further reduced.

The present exemplary embodiment will now be summarized.

The pattern wiring 3500 is a trace group including a plurality of traces.

A protrusion 3002 is formed between one and at least another adjoining one of the traces 3500 constituting the trace group 3500.

The pattern wiring 3500 is a trace group including a plurality of traces 3500.

Protrusions 3002 are formed between all adjoining ones of the traces 3500 constituting the trace group 3500.

Next, a wiring recess 4001 of a sensor module that is a fourth exemplary embodiment of the present invention will be described with reference to FIGS. 10A and 10B.

The only difference between the third exemplary embodiment and the present exemplary embodiment is the shape of the wiring recesses formed in the tops of the first and second side walls.

Figure 10A:
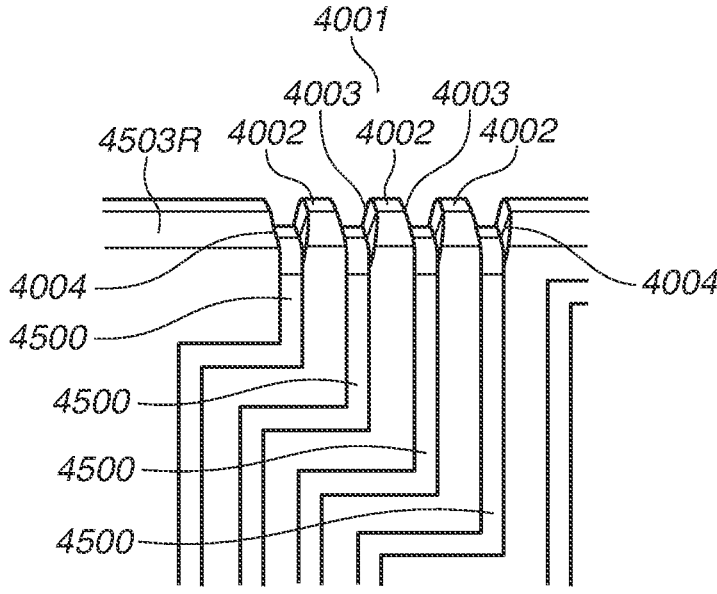
FIG. 10A is an enlarged view of a wiring recess according to a fourth exemplary embodiment of the present invention.

FIG. 10A is an enlarged view of the wiring recess 4001 according to the fourth exemplary embodiment of the present invention. FIG. 10B is a partial enlarged view of the wiring recess 4001.

Figure 10B:
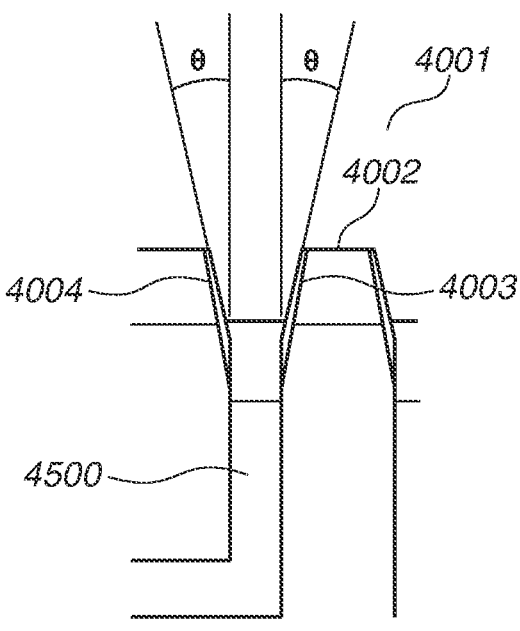
FIG. 10B is a partial enlarged view of the wiring recess according to the fourth exemplary embodiment of the present invention.

As illustrated in FIGS. 10A and 10B, the wiring recess 4001 is formed in an area at the top of a second side wall 4503R where pattern wiring 4500 passes.

The wiring recess 4001 includes protective protrusions 4002 between traces of the pattern wiring 4500.

In this respect, the wiring recess 4001 according to the fourth exemplary embodiment is similar to the wiring recess 3001 according to the third exemplary embodiment.

However, a difference lies in that wiring recess side walls 4004 that are the side walls of the wiring recess 4001 and protective protrusion side walls 4003 that are the side walls of the protective protrusions 4002 are provided with pattern wiring having the same potentials as those of the pattern wiring 4500.

In the present exemplary embodiment, the foregoing configuration enables further reduction in the risk of contact of the pattern wiring 4500 passing over the top of the second side wall 4503R with other members and tools.

Another effect will be described. Suppose that the pattern wiring 4500 passing over the top of the second side wall 4503R contacts another member or tool and is disconnected.

Even in such a case, the traces formed on the wiring recess side walls 4004 and the protective protrusion side walls 4003 serve as a bypass.

The bypass provides the function of transmitting predetermined signals.

The wiring recess side walls 4004 and the protective protrusion side walls 4003 are shaped to tilt by θ illustrated in FIG. 10B with respect to a plane perpendicular to the top of the second side wall 4503R.

In the present exemplary embodiment, such a configuration facilitates the laser irradiation of the wiring recess side walls 4004 and the protective protrusion side walls 4003 for the sake of pattern formation, thus improving productivity.

The present exemplary embodiment will now be summarized.

Opposed surfaces 4003 of adjoining ones of protrusions 4002 are provided with pattern wiring electrically connected to wiring pattern 4500 adjoining the protrusions 4002.

A distance between the opposed surface 4003 of either one of adjoining protrusions 4002 and the opposed surface 4003 of the other increases in a projecting direction of a projection 4503R.

An opposed surface of a projection 503P is a wall surface 503P for an electronic part 501P to be mounted on.

Next, a pattern protection structure for an area of a base member 5503 of a sensor module that is a fifth exemplary embodiment of the present invention where pattern wiring 5500 passes over a parting line 5501 will be described with reference to FIG. 11.

Figure 11:
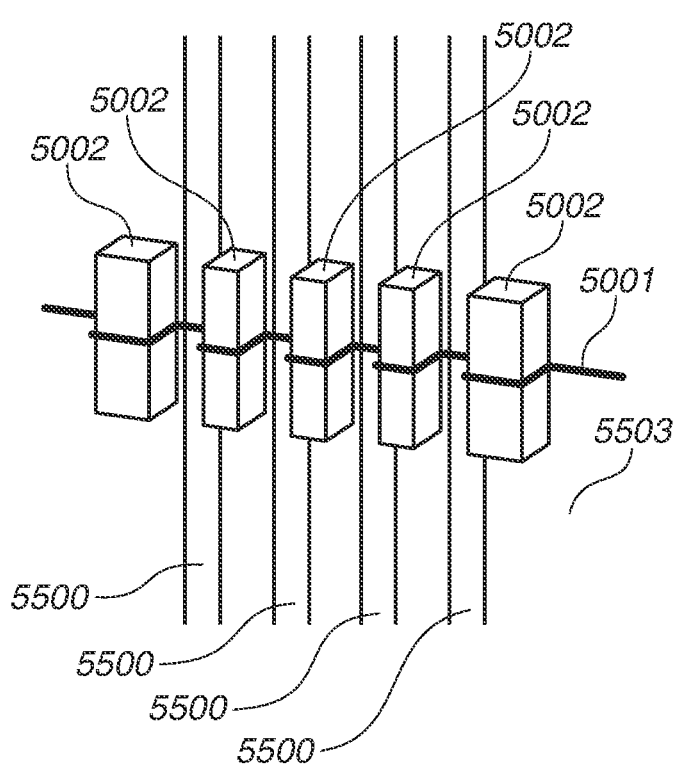
FIG. 11 is an enlarged view of a parting line according to a fifth exemplary embodiment of the present invention.

FIG. 11 is an enlarged view of the parting line 5001 according to the fifth exemplary embodiment of the present invention.

The parting line 5001 is a protrusion that is unintentionally formed on a portion of the base member 5503 corresponding to the mating of molds for molding the base member 5503 in molding the base member 5503.

Being a protrusion, the parting line 5001 is likely to contact other members and tools.

As illustrated in FIG. 11, if the pattern wiring 5500 passes over the parting line 5001, the portion passing over the parting line 5001 has the risk of disconnection due to contact with other members and tools.

In the present exemplary embodiment, protective protrusions 5002 are therefore disposed on both sides of the area where each trace of the pattern wiring 5500 passes over the parting line 5001.

The pattern wiring 5500 passing over the parting line 5001 is made less likely to contact other members and tools by the action of the protective protrusions 5002, thus reducing the risk of disconnection of the pattern wiring 5500.

The present exemplary embodiment will now be summarized.

The projection is a parting line 5001.

Next, a sensor module that is a sixth exemplary embodiment of the present invention will be described with reference to FIGS. 12A to 12C.

The only difference between the first exemplary embodiment and the present exemplary embodiment is the electrical connection mechanism between the sensor module and another member. Here, only differences of a sensor module 6508 according to the sixth exemplary embodiment from the sensor module 508 according to the first exemplary embodiment will therefore be described.

Figure 12A:
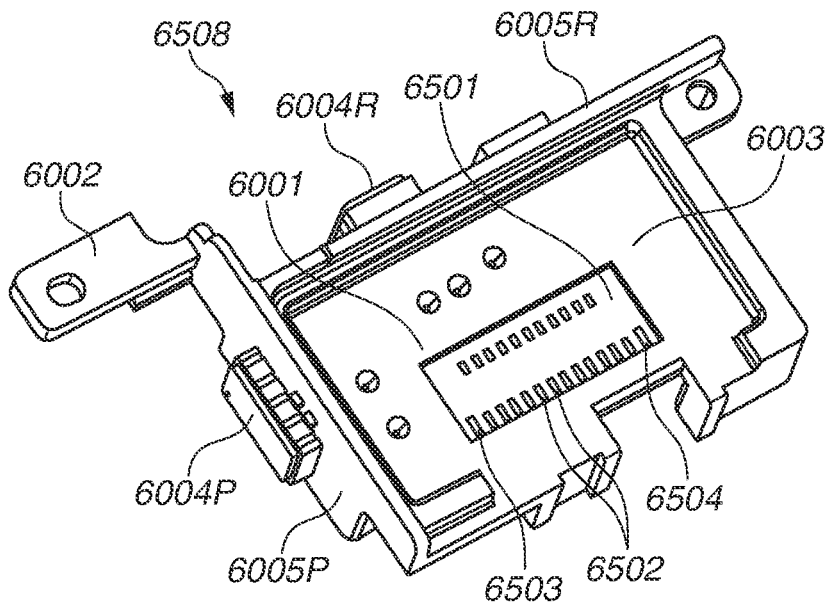
FIG. 12A is an external perspective view of a sensor module according to a sixth exemplary embodiment.

FIG. 12A is an external perspective view of the sensor module 6508. FIG. 12B is an enlarged perspective view of essential parts of a connection intermediary member 6600.

Figure 12B:
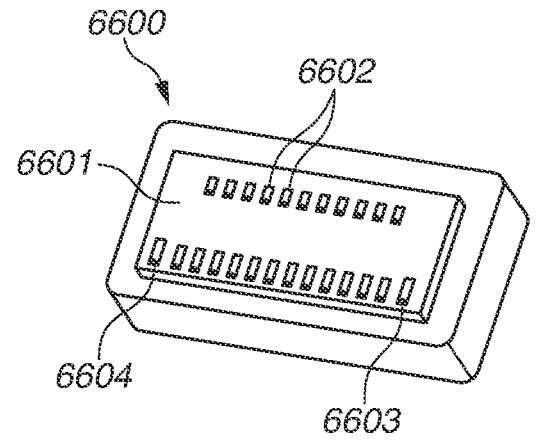
FIG. 12B is an enlarged perspective view of essential parts of a connection intermediary member according to the sixth exemplary embodiment.
Figure 12C:
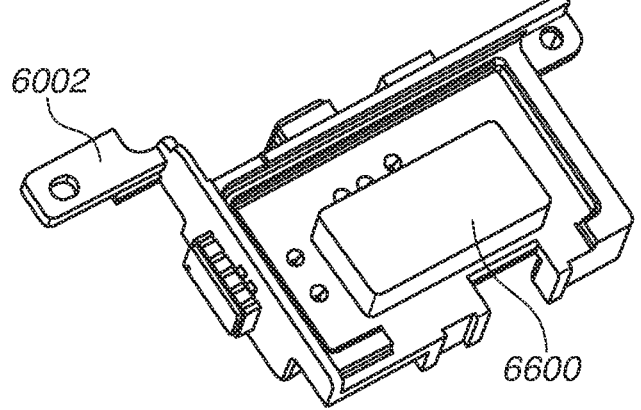
FIG. 12C is an external perspective view of the sensor module and the connection intermediary member according to the sixth exemplary embodiment in a state where the sensor module and the connection intermediary member are electrically connected.

FIG. 12C is an external perspective view of the sensor module 6508 and the connection intermediary member 6600 in a state where the sensor module 6508 and the connection intermediary member 6600 are electrically connected.

In FIGS. 12B and 12C, the connection intermediary member 6600 is simplified in shape, and only portions to be described are illustrated and the other portions are omitted for ease of understanding.

In FIGS. 12A to 12C, pattern wiring is omitted for ease of understanding, except for portions to be described.

In the first exemplary embodiment, the sensor module 508 and the system control unit 307 are described to be configured so that various types of predetermined communication can be performed via the flexible circuit board 502F.

The terminal portion 502D of the flexible circuit board 502F is connected to the connector 502C of the sensor module 508. The terminal portion 502E of the flexible circuit board 502F is electrically connected to the connector constituting a part of the path to the system control unit 307.

The sensor module 508 and the system control unit 307 are thereby configured so that various types of predetermined communication can be performed via the flexible circuit board 502F.

In other words, the flexible circuit board 502F is an example of a connection intermediary member that mediates electrical connection from the sensor module 508 to the system control unit 307.

The flexible circuit board 502F is electrically connected to the sensor module 508 via the connector 502C.

In the present exemplary embodiment, the connection intermediary member 6600 is the member that forms a part of the electrical communication path between the sensor module 6508 and the system control unit 307.

The connection intermediary member 6600 electrically connects to the sensor module 6508 using a mechanism different from the connector 502C.

The present exemplary embodiment is characterized in the electrical connection mechanism between the connection intermediary member 6600 and the sensor module 6508. A description will thus be focused on that point.

The sensor module 6508 includes a pitch direction detection gyro sensor 6004P, a roll direction detection gyro sensor 6004R, and a yaw direction detection gyro sensor (not illustrated) on a base member 6002.

The pitch direction detection gyro sensor 6004P, the roll direction detection gyro sensor 6004R, and the yaw direction detection gyro sensor (not illustrated) are mounted on a first side wall 6005P, a second side wall 6005R, and a main wall 6003, respectively.

Referring to FIG. 12A, an electrical connection portion 6001 serving as a part of the electrical connection mechanism between the connection intermediary member 6600 and the sensor module 6508 is formed in the main wall 6003 of the base member 6002.

The electrical connection portion 6001 includes an electrical connection recess 6501 that is a recess of rectangular solid shape, and a plurality of signal connection contacts 6502, a power connection contact 6503, and a ground connection contact 6504 formed at the bottom of the electrical connection recess 6501.

The signal connection contacts 6502 are connected to pattern wiring for electrically communicating with electronic elements mounted on the base member 6002, such as a gyro sensor.

The power connection contact 6503 is connected to pattern wiring for supplying power to the electronic elements, such as a gyro sensor.

The ground connection contact 6504 is connected to pattern wiring of a reference potential of the sensor module 6508.

As with the base member 503 of the first exemplary embodiment, the pattern wiring is directly formed on the connection intermediary member 6600 through the MID technique.

Referring to FIG. 12B, the connection intermediary member 6600 includes an electrical connection projection 6601 that is a projection of rectangular solid shape, serving as a part of the electrical connection mechanism between the connection intermediary member 6600 and the sensor module 6508.

A plurality of signal connection contact protrusions 6602, a power connection contact protrusion 6603, and a ground connection contact protrusion 6604 are formed on the top surface of the electrical connection projection 6601.

The plurality of signal connection contact protrusions 6602 is connected to pattern wiring for transmitting signals which are connected to the system control unit 307.

The power connection contact protrusion 6603 is connected to pattern wiring which is connected to a power supply control unit 313. The ground connection contact protrusion 6604 is connected to pattern wiring which is connected to the reference potential of the system control unit 307.

The electrical connection projection 6601 formed on the connection intermediary member 6600 is configured to be lightly-press fitted into the electrical connection recess 6501 formed in the base member 6002 in the state where the electrical connection projection 6601 is inserted into the electrical connection recess 6501 (see FIG. 12C).

The plurality of signal connection contacts 6502 and the plurality of corresponding signal connection contact protrusions 6602 are configured so that corresponding ones are opposed to each other in the state where the electrical connection projection 6601 is inserted into the electrical connection recess 6501.

The power connection contact 6503 and the power connection contact protrusion 6603 are also configured to be opposed to each other.

The ground connection contact 6504 and the ground connection contact protrusion 6604 are also configured to be opposed to each other.

The electrical connection projection 6601 is inserted into the electrical connection recess 6501.

The plurality of signal connection contact protrusions 6602 is configured to be abutted against and contact the plurality of signal connection contacts 6502 in the direction of insertion of the electrical connection projection 6601 into the electrical connection recess 6501.

Here, the power connection contact protrusion 6603 and the ground connection contact protrusion 6604 are also configured to be abutted against and contact the power connection contact 6503 and the ground connection contact 6504, respectively.

In other words, in the state of insertion of the electrical connection projection 6601 into the electrical connection recess 6501 illustrated in FIG. 12C, the electrical connection projection 6601 is fixed to the electrical connection recess 6501 by light fitting.

At the same time, the plurality of signal connection contact protrusions 6602 and the plurality of signal connection contacts 6502, the power connection contact protrusion 6603 and the power connection contact 6503, and the ground connection contact protrusion 6604 and the ground connection contact 6504 are electrically connected to each other.

The above is the description of the electrical connection mechanism between the connection intermediary member 6600 and the sensor module 6508 according to the present exemplary embodiment.

As compared to the case where the connector 502C is used as the electrical connection mechanism as in the first exemplary embodiment, the electrical connection mechanism according to the present exemplary embodiment is advantageous in terms of cost as much as the absence of the connector 502C.

The insertion of the electrical connection projection 6601 into the electrical connection recess 6501 also has an advantage of excellent workability as compared to the insertion of the flexible circuit board 502F into the connector 502C.

The present exemplary embodiment will now be summarized.

A first wiring part 6002 is a wiring part including a first base member 6002 or 6600 that is an injection-molded part and on which pattern wiring is directly formed.

A second wiring part 6600 is a wiring part including a second base member 6002 or 6600 that is an injection-molded part and on which pattern wiring is directly formed.

The first wiring part 6002 and the second wiring part 6600 constitute an electrically connected structure.

A recess 6501 is molded in the first wiring part 6002.

A projection 6601 having a shape corresponding to the recess 6501 is molded on the second wiring part 6600.

First electrodes 6502 are directly formed on a bottom surface of the recess 6501 through pattern wiring.

Second electrodes 6602 are directly formed on a top surface of the projection 6601 through pattern wiring.

The first and second electrodes 6502 and 6602 contact each other for electrical connection.

At least either the first electrodes 6502 or the second electrodes 6602 are protrusions.

Lands are flat non-protruding surfaces while bumps protrude. Lands and bumps thus contact firmly for favorable electrical connection. The first electrodes 6502 and the second electrodes 6602 both may be protrusions.

Next, a sensor module that is a seventh exemplary embodiment of the present invention will be described with reference to FIGS. 13A to 13D.

As in the sixth exemplary embodiment, the present exemplary embodiment is characterized in the electrical connection mechanism between the sensor module and another member.

Here, only differences of a sensor module 7510 and a connection intermediary member 7600 according to the seventh exemplary embodiment from the sensor module 6508 and the connection intermediary member 6600 according to the sixth exemplary embodiment will therefore be described.

Figure 13A:
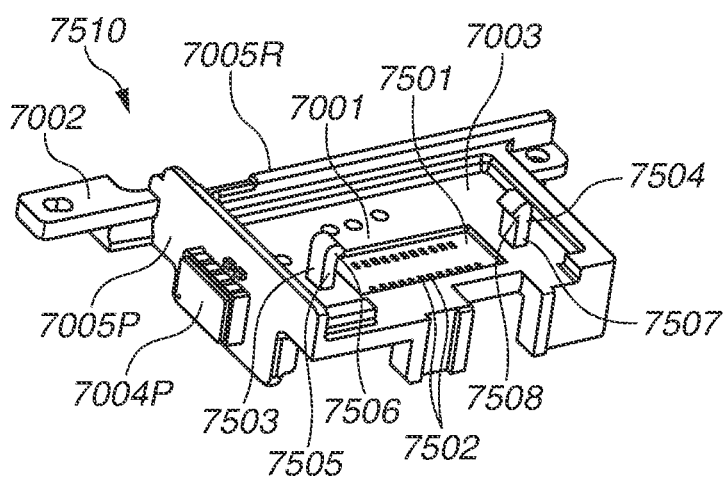
FIG. 13A is an external perspective view of a sensor module according to a seventh exemplary embodiment.
Figure 13B:
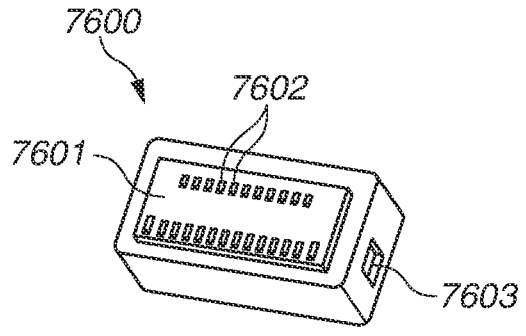
FIG. 13B is an enlarged perspective view of essential parts of a connection intermediary member according to the seventh exemplary embodiment.

FIG. 13A is an external perspective view of the sensor module 7510. FIG. 13B is an enlarged perspective view of essential parts of the connection intermediary member 7600.

Figure 13C:
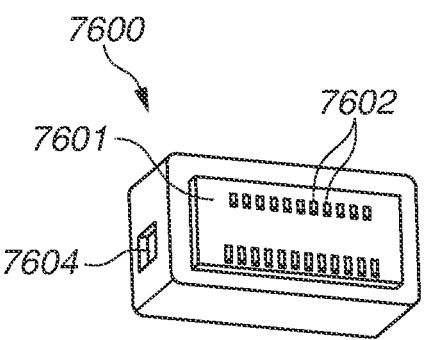
FIG. 13C illustrates the connection intermediary member according to the seventh exemplary embodiment.

FIG. 13C is an enlarged perspective view of the essential parts of the connection intermediary member 7600, seen at a different angle from in FIG. 13B.

Figure 13D:
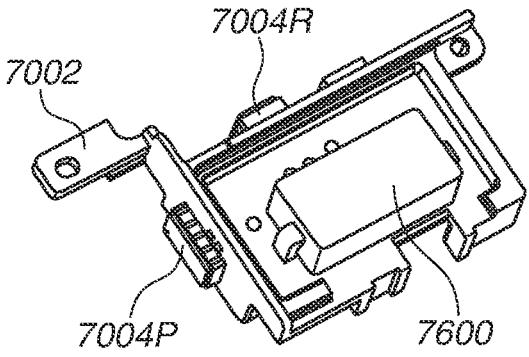
FIG. 13D is an external perspective view of the sensor module and the connection intermediary member according to the seventh exemplary embodiment in a state where the sensor module and the connection intermediary member are electrically connected.

FIG. 13D is an external perspective view of the sensor module 7510 and the connection intermediary member 7600 in a state where the sensor module 7510 and the connection intermediary member 7600 are electrically connected.

In FIGS. 13B, 13C, and 13D, the connection intermediary member 7600 is simplified in shape, and only portions concerning the description are illustrated and the other portions are omitted for ease of understanding.

In FIGS. 13A to 13D, pattern wiring is omitted for ease of understanding, except for portions to be described.

In the present exemplary embodiment, the connection intermediary member 7600 is a member constituting a part of an electrical communication path between the sensor module 7510 and a system control unit 307.

The connection intermediary member 7600 electrically connects to the sensor module 7510 using a mechanism different from a connector 502C.

The sensor module 7510 includes a pitch direction detection gyro sensor 7004P, a roll direction detection gyro sensor 7004R, and a yaw direction detection gyro sensor (not illustrated) on a base member 7002.

The pitch direction detection gyro sensor 7004P, the roll direction detection gyro sensor 7004R, and the yaw direction detection gyro sensor (not illustrated) are mounted on a first side wall 7005P, a second side wall 7005R, and a main wall 7003, respectively.

Referring to FIG. 13A, an electrical connection portion 7001 serving as a part of the electrical connection mechanism between the connection intermediary member 7600 and the sensor module 7510 is formed in the main wall 7003 of the base member 7002.

The electrical connection portion 7001 includes an electrical connection recess 7501 that is a recess of rectangular solid shape, and a plurality of signal connection contacts 7502 formed at the bottom of the electrical connection recess 7501.

The signal connection contacts 7502 are connected to pattern wiring for electrically communicating with electronic elements mounted on the base member 7002, such as a gyro sensor.

The electrical connection portion 7001 further includes a first latching portion 7503 and a second latching portion 7504.

The first and second latching portions 7503 and 7504 include posts 7505 and 7507 erected on both sides of the electrical connection recess 7501, and claws 7506 and 7508 disposed at the tips of the respective posts 7505 and 7507 toward the electrical connection recess 7501.

A pattern is formed on the claw 7506 of the first latching portion 7503. The pattern formed on the claw 7506 is connected to pattern wiring for supplying power to the electronic elements, such as a gyro sensor.

A pattern is formed on the claw 7508 of the second latching portion 7504. The pattern formed on the claw 7508 is connected to pattern wiring of a reference potential of the sensor module 7510.

As with the base member 503 of the first exemplary embodiment, the pattern wiring is directly formed on the connection intermediary member 7600 through the MID technique.

Referring to FIG. 13B, the connection intermediary member 7600 includes an electrical connection projection 7601 that is a projection of rectangular solid shape, serving as a part of the electrical connection mechanism between the connection intermediary member 7600 and the sensor module 7510.

A plurality of signal connection contact protrusions 7602 is formed on the top surface of the electrical connection projection 7601.

The plurality of signal connection contact protrusions 7602 is connected to pattern wiring for transmitting signals, which are connected to the system control unit 307.

The connection intermediary member 7600 has a first portion to be latched 7603 in one of its side surfaces, and a second portion to be latched 7604 in the opposite side surface.

The first portion to be latched 7603 is shaped by recessing a part of the connection intermediary member 7600. A pattern is formed on the surfaces constituting the first portion to be latched 7603.

The pattern formed on the surfaces constituting the first portion to be latched 7603 is connected to pattern wiring which is connected to a power supply control unit 313.

The second portion to be latched 7604 is shaped by recessing a part of the connection intermediary member 7600. A pattern is formed on the surfaces constituting the second portion to be latched 7604.

The pattern formed on the surfaces constituting the second portion to be latched 7604 is connected to pattern wiring which is connected to the reference potential of the system control unit 307.

The following description will be given with reference to FIG. 13D.

The electrical connection projection 7601 formed on the connection intermediary member 7600 is configured to be lightly-press fitted into the electrical connection recess 7501 formed in the base member 7002 in the state where the electrical connection projection 7601 is inserted into the electrical connection recess 7501.

The plurality of signal connection contacts 7502 and the plurality of corresponding signal connection contact protrusions 7602 are configured so that corresponding ones are opposed to each other in the state where the electrical connection projection 7601 is inserted into the electrical connection recess 7501.

The electrical connection projection 7601 is inserted into the electrical connection recess 7501.

The plurality of signal connection contact protrusions 7602 is configured to be abutted against and contact the plurality of signal connection contacts 7502 in the direction of insertion of the electrical connection projection 7601 into the electrical connection recess 7501.

In other words, in the state of insertion of the electrical connection projection 7601 into the electrical connection recess 7501 illustrated in FIG. 13D, the electrical connection projection 7601 is fixed to the electrical connection recess 7501 by light press fitting.

At the same time, the plurality of signal connection contact protrusions 7602 and the plurality of signal connection contacts 7502 are electrically connected.

The claws 7506 and 7508 are formed so that the distance between their tips is slightly smaller than the width of the portion of the connection intermediary member 7600 where the electrical connection projection 7601 is disposed.

The posts 7505 and 7507 are formed so that the distance therebetween is slightly greater than the width of the portion of the connection intermediary member 7600 where the electrical connection projection 7601 is disposed.

The first portion to be latched 7603 is configured to allow the claw 7506 to enter therein. The second portion to be latched 7604 is configured to allow the claw 7508 to enter therein.

The electrical connection projection 7601 is thus inserted into the electrical connection recess 7501.

Here, the claw 7506 of the first latching portion 7503 is pushed by the connection intermediary member 7600 and the post 7505 is elastically deformed in a direction away from the connection intermediary member 7600.

The electrical connection projection 7601 is then inserted into the electrical connection recess 7501 until the plurality of signal connection contact protrusions 7602 is abutted against and contacts the plurality of signal connection contacts 7502.

As a result, the claw 7506 and the first portion to be latched 7603 are brought into alignment, and the elastic deformation of the post 7505 is resolved and the claw 7506 enters the first portion to be latched 7603.

In inserting the electrical connection projection 7601 into the electrical connection recess 7501, the claw 7508 of the second latching portion 7504 is also pushed by the connection intermediary member 7600 and the post 7507 is elastically deformed in a direction away from the connection intermediary member 7600.

The electrical connection projection 7601 is then inserted into the electrical connection recess 7501 until the plurality of signal connection contact protrusions 7602 is abutted against and contacts the plurality of signal connection contacts 7502.

As a result, the claw 7507 and the second portion to be latched 7604 are brought into alignment, and the elastic deformation of the post 7507 is resolved and the claw 7508 enters the second portion to be latched 7604.

Among the surfaces constituting the first portion to be latched 7603, the one located close to the electrical connection projection 7601 in the direction of insertion of the electrical connection projection 7601 into the electrical connection recess 7501 contacts the claw 7506.

Among the surfaces constituting the second portion to be latched 7604, the one located close to the electrical connection projection 7601 in the direction of insertion of the electrical connection projection 7601 into the electrical connection recess 7501 contacts the claw 7508.

This reinforces the fixing of the base member 7002 and the connection intermediary member 7600 when the electrical connection projection 7601 is inserted into the electrical connection recess 7501.

Moreover, the pattern formed on the claw 7506 and the pattern formed on the first portion to be latched 7603 contact each other.

This establishes an electrical connection for transmitting power between the base member 7002 and the connection intermediary member 7600.

Moreover, the pattern formed on the claw 7508 and the pattern formed on the second portion to be latched 7604 contact each other.

This establishes an electrical connection for transmitting the reference potential between the base member 7002 and the connection intermediary member 7600.

The above is the description of the electrical connection mechanism between the connection intermediary member 7600 and the sensor module 7510 according to the present exemplary embodiment.

As compared to the electrical connection mechanism according to the sixth exemplary embodiment, the electrical connection mechanism according to the present exemplary embodiment reinforces the fixing of the base member 7002 and the connection intermediary member 7600 when the electrical connection projection 7601 is inserted into the electrical connection recess 7501.

The fixing of the base member 7002 and the connection intermediary member 7600 when the electrical connection projection 7601 is inserted into the electrical connection recess 7501 is reinforced by the action of the first latching portion 7503, the second latching portion 7504, the first portion to be latched 7603, and the second portion to be latched 7604.

Moreover, the contact areas of the electrical connections of the power supply and the reference potential, of which resistances are desirably made relatively low, can be increased to reduce the contact resistances.

Since neither a power connection contact nor a ground connection contact needs to be disposed at the bottom of the electrical connection recess 6501, an area for pattern wiring around the signal connection contacts 7502 is easily allocated.

Since neither a power connection contact protrusion nor a ground connection contact protrusion needs to be disposed on the top surface of the electrical connection projection 6601, an area for pattern wiring around the signal connection contact protrusions 7602 is easily allocated.

The present exemplary embodiment will now be summarized.

Latching portions 7503 and 7504 are molded on a first wiring part 7002.

Portions to be latched 7603 and 7604 are molded in a second wiring part 7600.

The first and second wiring parts 7002 and 7600 are mechanically fixed to each other by the latching portions 7503 and 7504 latching with the portions to be latched 7603 and 7604.

Pattern wiring formed on the latching portions 7503 and 7504 and pattern wiring formed on the portions to be latched 7603 and 7604 contact each other for electrical connection.

The pattern wiring formed on the latching portions 7503 and 7504 and the pattern wiring formed on the portions to be latched 7603 and 7604 are electrically connected to a reference potential or a power supply.

Next, a sensor module that is an eighth exemplary embodiment of the present invention will be described with reference to FIGS. 14A to 14C.

The present exemplary embodiment is a modification of the electrical connection mechanism between the sensor module and another member, described in the seventh exemplary embodiment.

Here, only differences of a sensor module 8510 and a connection intermediary member 8600 according to the eighth exemplary embodiment from the sensor module 7510 and the connection intermediary member 7600 according to the seventh exemplary embodiment will therefore be described.

Figure 14A:
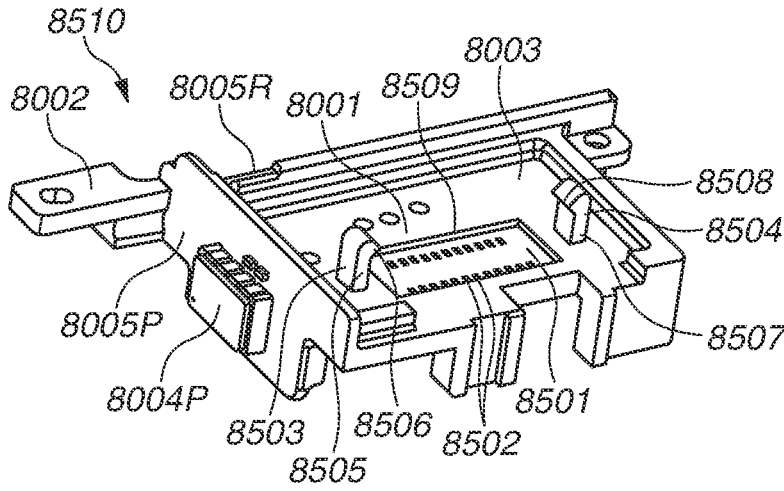
FIG. 14A is an external perspective view of a sensor module according to an eighth exemplary embodiment.

FIG. 14A is an external perspective view of the sensor module 8510. FIG. 14B is an enlarged perspective view of essential parts of the connection intermediary member 8600.

Figure 14B:
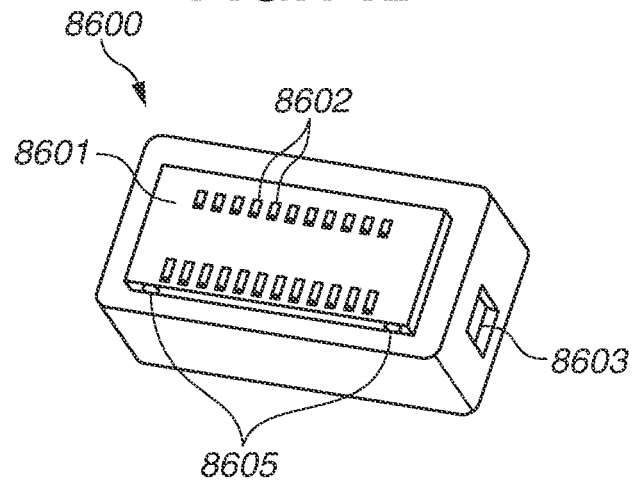
FIG. 14B is an enlarged perspective view of essential parts of a connection intermediary member according to the eighth exemplary embodiment.
Figure 14C:
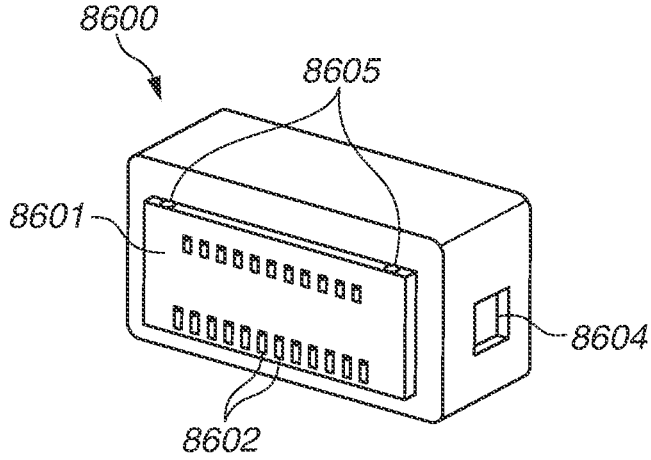
FIG. 14C is an enlarged perspective view of essential parts of a connection intermediary member according to the eighth exemplary embodiment.

FIG. 14C is an external perspective view of the essential parts of the connection intermediary member 8600, seen at a different angle from in FIG. 14B.

In FIGS. 14B and 14C, the connection intermediary member 8600 is simplified in shape, and only portions concerning the description are illustrated and the other portions are omitted for ease of understanding.

In FIGS. 14A to 14C, pattern wiring is omitted for ease of understanding, except for portions to be described.

In the present exemplary embodiment, the connection intermediary member 8600 forms a part of an electrical communication path between the sensor module 8510 and a system control unit 307.

The connection intermediary member 8600 electrically connects to the sensor module 8510 using a mechanism different from a connector 502C.

The sensor module 8510 includes a pitch direction detection gyro sensor 8004P, a roll direction detection gyro sensor (not illustrated), and a yaw direction detection gyro sensor (not illustrated) on a base member 8002.

The pitch direction detection gyro sensor 8004P, the roll direction detection gyro sensor (not illustrated), and the yaw direction detection gyro sensor (not illustrated) are mounted on a first side wall 8005P, a second side wall 8005R, and a main wall 8003, respectively.

Referring to FIG. 14A, an electrical connection portion 8001 serving as a part of the electrical connection mechanism between the connection intermediary member 8600 and the sensor module 8510 is formed in the main wall 8003 of the base member 8002.

The electrical connection portion 8001 includes an electrical connection recess 8501 that is a recess of rectangular solid shape, and a plurality of signal connection contacts 8502 formed at the bottom of the electrical connection recess 8501.

The signal connection contacts 8502 are connected to pattern wiring for electrically communicating with electronic elements mounted on the base member 8002, such as a gyro sensor.

A pattern is formed on some or all of four surfaces 8509 of the electrical connection recess 8501 other than the bottom surface.

The pattern formed on some or all of the four surfaces 8509 of the electrical connection recess 8501 other than the bottom surface is connected to pattern wiring of a reference potential of the sensor module 8510.

The electrical connection portion 8001 further includes a first latching portion 8503 and a second latching portion 8504.

The first and second latching portions 8503 and 8504 include posts 8505 and 8507 erected on both sides of the electrical connection recess 8501, and claws 8506 and 8508 disposed at the tips of the respective posts 8505 and 8507 toward the electrical connection recess 8501.

Here, a pattern is formed on the claw 8506 of the first latching portion 8503. The pattern formed on the claw 8506 is connected to pattern wiring for supplying power to the electronic elements, such as a gyro sensor.

A pattern is formed on the claw 8508 of the second latching portion 8504. The pattern formed on the claw 8508 is connected to the pattern wiring of the reference potential of the sensor module 8510.

As with the base member 503 of the first exemplary embodiment, the pattern wiring is directly formed on the connection intermediary member 8600 by the MID technique.

Referring to FIG. 14B, the connection intermediary member 8600 includes an electrical connection projection 8601 that is a projection of rectangular solid shape, serving as a part of the electrical connection mechanism between the connection intermediary member 8600 and the sensor module 8510.

A plurality of signal connection contact protrusions 8602 is formed on the top surface of the electrical connection projection 8601.

The plurality of signal connection contact protrusions 8602 is connected to pattern wiring for transmitting signals which is connected to the system control unit 307.

Four electrical connection projection side wall protrusions 8605 are formed on side surfaces of the electrical connection projection 8601.

A pattern is formed on the electrical connection projection side wall protrusions 8605. The pattern formed on the electrical connection projection side wall protrusions 8605 is connected to the pattern wiring of the reference potential of the system control unit 307.

The connection intermediary member 8600 includes a first portion to be latched 8603 in one of its side surfaces, and a second portion to be latched 8604 in the opposite side surface.

The first portion to be latched 8603 is shaped by recessing a part of the connection intermediary member 8600. A pattern is formed on the surfaces constituting the first portion to be latched 8603.

The pattern formed on the surfaces constituting the first portion to be latched 8603 is connected to pattern wiring which is connected to a power supply control unit 313.

The second portion to be latched 8604 is shaped by recessing a part of the connection intermediary member 8600. A pattern is formed on the surfaces constituting the second portion to be latched 8604.

The pattern formed on the surfaces constituting the second portion to be latched 8604 is connected to the pattern wiring which is connected to the reference potential of the system control unit 307.

The electrical connection projection 8601 formed on the connection intermediary member 8600 is configured to be lightly-press fitted into the electrical connection recess 8501 formed in the base member 8002 in the state where the electrical connection projection 8601 is inserted into the electrical connection recess 8501 (see FIG. 13D).

The plurality of signal connection contacts 8502 and the plurality of corresponding signal connection contact protrusions 8602 are configured so that corresponding ones are opposed to each other in the state where the electrical connection projection 8601 is inserted into the electrical connection recess 8501.

The electrical connection projection 8601 is inserted into the electrical connection recess 8501.

The plurality of signal connection contact protrusions 8602 is thus configured to be abutted against and contact the plurality of signal connection contacts 8502 in the direction of insertion of the electrical connection projection 8601 into the electrical connection recess 8501.

In other words, in the state of insertion of the electrical connection projection 8601 into the electrical connection recess 8501, the electrical connection projection 8601 is fixed to the electrical connection recess 8501 by light press fitting.

At the same time, the plurality of signal connection contact protrusions 8602 and the plurality of signal connection contacts 8502 are electrically connected to each other.

The electrical connection projection side wall protrusions 8605 are arranged to contact the pattern-formed portions of the four surfaces 8509 of the electrical connection recess 8501 other than the bottom surface in the state where the electrical connection projection 8601 is inserted into the electrical connection recess 8501.

The insertion of the electrical connection projection 8601 into the electrical connection recess 8501 thus establishes an electric connection between the pattern formed on the electrical connection projection side wall protrusions 8605 and the pattern formed on the four surfaces 8509 of the electrical connection recess 8501 other than the bottom surface.

The claws 8506 and 8508 are formed so that the distance between their tips is slightly smaller than the width of the portion of the connection intermediary member 8600 where the electrical connection projection 8601 is disposed.

The posts 8505 and 8507 are formed so that the distance therebetween is slightly greater than the width of the portion of the connection intermediary member 8600 where the electrical connection projection 8601 is disposed.

The first portion to be latched 8603 is configured to allow the claw 8506 to enter therein. The second portion to be latched 8604 is configured to allow the claw 8508 to enter therein.

In inserting the electrical connection projection 8601 into the electrical connection recess 8501, the claw 8506 of the first latching portion 8503 is thus pushed by the connection intermediary member 8600 and the post 8505 is elastically deformed in a direction away from the connection intermediary member 8600.

The electrical connection projection 8601 is then inserted into the electrical connection recess 8501 until the plurality of signal connection contact protrusions 8602 is abutted against and contacts the plurality of signal connection contacts 8502.

As a result, the claw 8506 and the first portion to be latched 8603 are brought into alignment, and the elastic deformation of the post 8505 is resolved and the claw 8506 enters the first portion to be latched 8603.

In inserting the electrical connection projection 8601 into the electrical connection recess 8501, the claw 8508 of the second latching portion 8504 is pushed by the connection intermediary member 8600 and the post 8507 is elastically deformed in a direction away from the connection intermediary member 8600.

The electrical connection projection 8601 is then inserted into the electrical connection recess 8501 until the plurality of signal connection contact protrusions 8602 is abutted against and contacts the plurality of signal connection contacts 8502.

As a result, the claw 8507 and the second portion to be latched 8604 are brought into alignment, and the elastic deformation of the post 8507 is resolved and the claw 8508 enters the second portion to be latched 8604.

Among the surfaces constituting the first portion to be latched 8603, the one located close to the electrical connection projection 8601 in the direction of insertion of the electrical connection projection 8601 into the electrical connection recess 8501 contacts the claw 8506.

Among the surfaces constituting the second portion to be latched 8604, the one located close to the electrical connection projection 8601 in the direction of insertion of the electrical connection projection 8601 into the electrical connection recess 8501 contacts the claw 8508.

This reinforces the fixing of the base member 8002 and the connection intermediary member 8600 when the electrical connection projection 8601 is inserted into the electrical connection recess 8501.

The contact of the pattern formed on the claw 8506 with the pattern formed on the first portion to be latched 8603 establishes an electric connection for transmitting power between the base member 8002 and the connection intermediary member 8600.

Moreover, the contact of the pattern formed on the claw 8508 with the pattern formed on the second portion to be latched 8604 establishes an electrical connection for transmitting the reference potential between the base member 8002 and the connection intermediary member 8600.

The foregoing is the description of the electrical connection mechanism between the connection intermediary member 8600 and the sensor module 8510 according to the present exemplary embodiment.

The electrical connection mechanism according to the present exemplary embodiment electrically connects the pattern formed on the electrical connection projection side wall protrusions 8605 with the pattern formed on the four surfaces 8509 of the electrical connection recess 8501 other than the bottom surface.

This reinforces the electrical connection of the reference potential between the connection intermediary member 8600 and the sensor module 8510.

The connections between the signal connection contact protrusions 8602 and the signal connection contacts 8502 may typically cause unwanted radiation noise.

However, the provision of the pattern connected to the reference potential on at least some of the four surfaces 8509 of the electrical connection recess 8501 other than the bottom surface enables reduction or prevention of leakage of the unwanted radiation noise from the electrical connection recess 8501.

To implement hot plugging with this electric connection mechanism, the electric connection projection 8601 is inserted into the electrical connection recess 8501.

In doing so, the electrical connection between the pattern formed on the electrical connection projection side wall protrusions 8605 and the pattern formed on the electrical connection recess 8501 is desirably configured to be established earlier than the other electrical connections.

The present exemplary embodiment will now be summarized.

Pattern wiring is formed on a side surface 8509 of a recess 8501.

A third electrode 8603 of protruding shape is directly formed on a side surface of a projection 8601 by pattern wiring.

The pattern wiring formed on the side surface 8509 of the recess 8501 and the third electrode 8603 contact each other, thus establishing electrical connection.

Pattern wiring formed on the side surface 8509 of the recess 8501 to surround a first electrode is electrically connected to a reference potential.

The third electrode 8603 is a bump of protruding shape.

Next, a sensor module that is an eighth exemplary embodiment of the present invention will be described with reference to FIGS. 15A to 15C.

The present exemplary embodiment is a modification of the electrical connection mechanism between the sensor module and another member, described in the sixth exemplary embodiment.

Here, only differences of a base member 9002 and a connection intermediary member 9600 included in the sensor module according to the ninth exemplary embodiment from the sensor module 6508 and the connection intermediary member 6600 of the sixth exemplary embodiment will therefore be described.

Figure 15A:
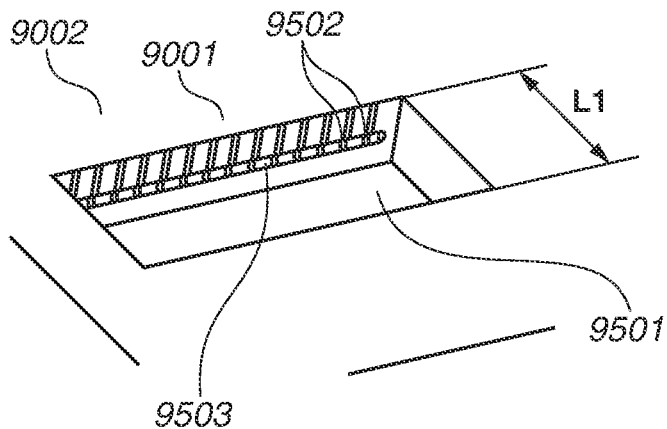
FIG. 15A is an enlarged perspective view of essential parts of a base member according to a ninth exemplary embodiment.

FIG. 15A is an enlarged perspective view of essential parts of the base member 9002. FIG. 15B is an enlarged perspective view of essential parts of the connection intermediary member 9600. FIG. 15C is an enlarged sectional view of the essential parts when the base member 9002 and the connection intermediary member 9600 are connected.

Figure 15B:
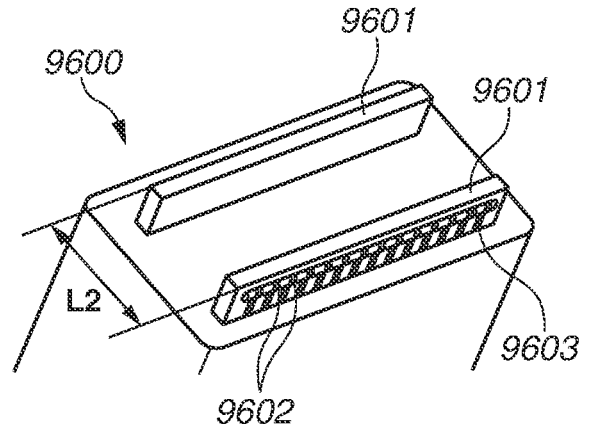
FIG. 15B is an enlarged perspective view of essential parts of a connection intermediary member according to the ninth exemplary embodiment.
Figure 15C:
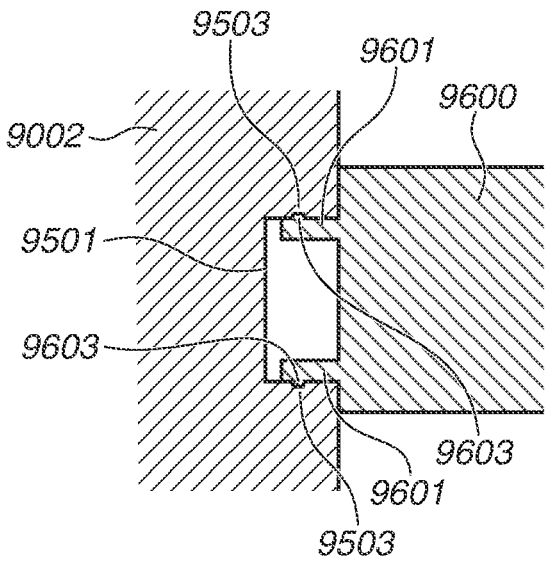
FIG. 15C is an enlarged sectional view of the essential parts when the base member and the connection intermediary member according to the ninth exemplary embodiment are connected.

In FIGS. 15A to 15C, pattern wiring is omitted for ease of understanding, except for portions to be described.

In the present exemplary embodiment, the connection intermediary member 9600 is a member forming a part of an electrical communication path between the base member 9002 and a system control unit 307.

The connection intermediary member 9600 electrically connects to the base member 9002 using a mechanism different from a connector 502C.

As with the base member 503 according to the first exemplary embodiment, pattern wiring is directly formed on the base member 9002 by the MID technique.

Referring to FIG. 15A, an electrical connection portion 9001 serving as a part of the electrical connection mechanism between the connection intermediary member 9600 and the base member 9002 is formed in the base member 9002.

The electrical connection portion 9001 includes an electrical connection recess 9501 that is a recess of rectangular solid shape, and a linear groove 9503 formed in each of two opposed surfaces of the electrical connection recess 9501.

A plurality of signal connection traces 9502 is formed in the linear grooves 9503 at predetermined pitches along the longitudinal direction.

As with the base member 503 of the first exemplary embodiment, pattern wiring is directly formed on the connection intermediary member 9600 through the MID technique.

Referring to FIG. 15B, electrical connection projections 9601 are formed on the connection intermediary member 9600. The electrical connection projections 9601 are two opposed plate-shaped projections serving as a part of the electrical connection mechanism between the connection intermediary member 9600 and the base member 9503.

Linear protrusions 9603 are formed on the not-opposed sides of the two respective electrical connection projections 9601. A plurality of signal connection traces 9602 is formed on the linear projections 9603 at predetermined pitches along the longitudinal direction.

The width (L1 in FIG. 15A) of the electrical connection recess 9501 and the distance (L2 in FIG. 15B) between the not-opposed sides of the two electrical connection projections 9601 are set so that L1 and L2 are equal, or L2 is slightly smaller.

The linear grooves 9503 are shaped so that the linear protrusions 9603 are fitly accommodated.

The electrical connection projections 9601 formed on the connection intermediary member 9600 are thus inserted into the electrical connection recess 9501 formed in the base member 9002.

The linear protrusions 9603 are pushed by the base member 9002, so that the two electrical connection projections 9601 are elastically deformed toward each other.

When the electrical connection projections 9601 are further inserted into the electrical connection recess 9501, the linear protrusions 9603 are accommodated into the linear grooves 9503 and the elastic deformation is resolved.

The connection intermediary member 9600 and the base member 9002 are thus fixed by the action of the linear grooves 9503 and the linear protrusions 9603 (state of FIG. 15C).

Here, the respective corresponding pairs of the signal connection traces 9502 formed in the linear grooves 9503 and the signal connection traces 9602 formed on the linear protrusions 9603 contact each other.

Thus, the connection intermediary member 9600 and the base member 9002 are electrically connected.

The foregoing is the description of the electrical connection mechanism between the connection intermediary member 9600 and the base member 9002 according to the present exemplary embodiment.

As compared to the case in which the connector 502C is used as the electrical connection mechanism as in the first exemplary embodiment, the electrical connection mechanism according to the present exemplary embodiment is advantageous in terms of cost as much as the absence of the connector 502C.

Moreover, the insertion of the electrical connection projections 9601 into the electrical connection recess 9501 has an advantage of excellent workability compared to the insertion of the flexible circuit board 502F into the connector 502C.

The present exemplary embodiment will now be summarized.

A first wiring part 9002 is a wiring part including a base member 9002 or 9600 that is a molded part and on which pattern wiring is directly formed.

A second wiring part 9600 is a wiring part including a base member 9002 or 9600 that is a molded part and on which pattern wiring is directly formed on.

The first and second wiring parts 9002 and 9600 constitute an electrically connected structure.

A recess 9501 is molded in the first wiring part 9002.

A plurality of plate-shaped projections 9601 is molded on the second wiring part 9600.

Linear grooves 9503 are molded in respective opposed side surfaces of the recess 9501.

Linear protrusions 9603 are molded on respective not-opposed side surfaces of the plate-shaped projections 9601.

Fourth electrodes 9502 are directly formed at the bottoms of the linear grooves 9503 by pattern wiring.

Fifth electrodes 9602 are directly formed on the tops of the linear protrusions 9603 by pattern wiring.

The first and second wiring parts 9002 and 9600 are mechanically fixed by engagement of the linear grooves 9503 with the linear protrusions 9603.

The first and second wiring parts 9002 and 9600 are electrically connected by contact of the fourth electrodes 9502 and the fifth electrodes 9602.

The plurality of plate-shaped projections 9601 are two parallel plate-shaped projections 9601.

Other Exemplary Embodiments

While the exemplary embodiments of the present invention have been described above, the present invention is not limited to the configurations described in the foregoing exemplary embodiments, and materials, shapes, dimensions, forms, numbers, and locations of arrangement can be modified as appropriate without departing from the gist of the present invention. While the exemplary embodiments of the present invention have been described using a camera among electronic devices as an example, the exemplary embodiments of the present invention are applicable to various electronic devices including a personal computer, a tablet terminal, a game machine, a drone, an automobile, and peripheral devices thereof.

The present invention is not limited to the foregoing exemplary embodiments, and various changes and modifications can be made without departing from the spirit and scope of the present invention. The following claims are therefore appended to make the scope of the present invention public.

According to an exemplary embodiment of the present invention, a small-sized base member having a shape suitable for accommodation in an electronic device can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A base member that is a molded part on which pattern wiring is directly formed, the base member comprising
   a projection projecting from a base surface of the base member,
   wherein the pattern wiring is laid over a top of the projection, and
   wherein protrusions are molded on both sides of an area at the top of the projection where the pattern wiring passes,
   wherein the pattern wiring is a trace group including a plurality of traces, and
   wherein protrusions are molded between all adjoining ones of the traces of the trace group.

2. The base member according to claim 1,
   wherein the pattern wiring is a trace group including a plurality of traces, and
   wherein a protrusion is molded between one and at least another adjoining one of the traces of the trace group.

3. The base member according to claim 1, wherein an opposed surface of the projection is a wall surface for an electronic part to be mounted on.

4. The base member according to claim 1, wherein the projection is a parting line.

5. An electronic device comprising the base member according to claim 1.

6. A base member that is a molded part on which pattern wiring is directly formed, the base member comprising a projection projecting from a base surface of the base member, wherein the pattern wiring is laid over a top of the projection, wherein protrusions are molded on both sides of an area at the top of the projection where the pattern wiring passes, and wherein opposed surfaces of adjoining ones of the protrusions are provided with pattern wiring electrically connected to the pattern wiring adjoining the protrusions.

7. The base member according to claim 6, wherein a distance between the opposed surface of one of the adjoining protrusions and the opposed surface of the other opposed to the opposed surface of the one protrusion increases in a projecting direction of the projection.

8. The base member according to claim 6, wherein the pattern wiring is a trace group including a plurality of traces, and wherein a protrusion is molded between one and at least another adjoining one of the traces of the trace group.

9. The base member according to claim 6, wherein an opposed surface of the projection is a wall surface for an electronic part to be mounted on.

10. The base member according to claim 6, wherein the projection is a parting line.

11. An electronic device comprising the base member according to claim 6.

12. A structure, comprising:

a first wiring part including a first base member that is a molded part and on which pattern wiring is directly formed; and a second wiring part including a second base member that is a molded part and on which pattern wiring is directly formed, the first and second wiring parts which are electrically connected, wherein a recess is molded in the first wiring part, wherein a projection having a shape corresponding to the recess is molded on the second wiring part, wherein a first electrode is directly formed on a bottom surface of the recess by the pattern wiring, and a second electrode is directly formed on a top surface of the projection by the pattern wiring, and wherein electrical connection is established by the first and second electrodes contacting each other, wherein the first wiring part includes a latching portion, wherein the second wiring part includes a portion to be latched, wherein the first and second wiring parts are mechanically fixed to each other by the latching portion latching with the portion to be latched, and wherein electrical connection is established by pattern wiring formed on the latching portion and pattern wiring formed on the portion to be latched contacting each other.

13. The structure according to claim 12, wherein the pattern wiring formed on the latching portion and the pattern wiring formed on the portion to be latched are electrically connected to a reference potential or a power supply.

14. The structure according to claim 12, wherein pattern wiring is formed on a side surface of the recess, wherein a third electrode of protruding shape is directly formed on a side surface of the protrusion by the pattern wiring, and wherein electrical connection is established by the pattern wiring formed on the side surface of the recess and the third electrode contacting each other.

15. The structure according to claim 14, wherein pattern wiring formed on the side surface of the recess to surround the first electrode is electrically connected to a reference potential.

16. The structure according to claim 14, wherein the third electrode has a protruding shape.

17. The structure according to claim 12, wherein at least either one of the first and second electrodes has a protruding shape.

18. An electronic device comprising the structure according to claim 12.

* * * * *